(12) United States Patent
Closs et al.

(10) Patent No.: US 12,366,509 B2
(45) Date of Patent: Jul. 22, 2025

(54) SAMPLE SUPPORTS AND SAMPLE COOLING SYSTEMS FOR CRYO-ELECTRON MICROSCOPY

(71) Applicant: MiTeGen, LLC, Ithaca, NY (US)

(72) Inventors: David Closs, Freeville, NY (US); Benjamin Apker, Barton, NY (US); Robert E. Thorne, Ithaca, NY (US)

(73) Assignee: MiTeGen, LLC, Ithac, NY (US)

( * ) Notice: Subject to any disclaimer, the term of this patent is extended or adjusted under 35 U.S.C. 154(b) by 843 days.

(21) Appl. No.: 17/632,385

(22) PCT Filed: Oct. 5, 2020

(86) PCT No.: PCT/US2020/054272
§ 371 (c)(1),
(2) Date: Feb. 2, 2022

(87) PCT Pub. No.: WO2021/067940
PCT Pub. Date: Apr. 8, 2021

(65) Prior Publication Data
US 2022/0291098 A1 Sep. 15, 2022

Related U.S. Application Data

(60) Provisional application No. 62/910,511, filed on Oct. 4, 2019.

(51) Int. Cl.
G01N 1/42 (2006.01)
G01N 1/40 (2006.01)
(Continued)

(52) U.S. Cl.
CPC ............. *G01N 1/42* (2013.01); *G01N 1/4022* (2013.01); *G01N 35/00732* (2013.01);
(Continued)

(58) Field of Classification Search
None
See application file for complete search history.

(56) References Cited

U.S. PATENT DOCUMENTS

| 7,263,162 | B2 | 8/2007 | Thorne et al. | |
| 8,141,767 | B2 * | 3/2012 | Liu | H01J 37/20 228/136 |

(Continued)

FOREIGN PATENT DOCUMENTS

| CN | 1444494 A | 9/2003 |
| CN | 105531792 A | 4/2016 |

(Continued)

OTHER PUBLICATIONS

Ermantraut et al., "Perforated support foils with pre-defined hole size shape and arrangement," Institute for Ultrastructure Research, Germany, Jul. 1, 1998.

(Continued)

*Primary Examiner* — Brian R Gordon
(74) *Attorney, Agent, or Firm* — Quinn IP Law

(57) ABSTRACT

The invention is directed to a sample support design and sample cooling devices for single-particle cryo-electron microscopy that simplify sample preparation and handling, dramatically reduce errors and improve outcome reproducibility, and dramatically reduce overall costs. A system includes a grid based sample support system, grid handling tools, grid blotting tools, a plunge cooling system, and jet cooling systems.

14 Claims, 14 Drawing Sheets

(51) Int. Cl.
*G01N 35/00* (2006.01)
*H01J 37/20* (2006.01)

(52) U.S. Cl.
CPC ...... *H01J 37/20* (2013.01); *G01N 2001/4033* (2013.01); *H01J 2237/002* (2013.01); *H01J 2237/2602* (2013.01)

(56) References Cited

U.S. PATENT DOCUMENTS

| | | | |
|---|---|---|---|
| 8,210,057 | B2 | 7/2012 | Thorne et al. |
| 8,387,227 | B2 * | 3/2013 | Liu .................. B32B 15/20 250/311 |
| 8,581,205 | B2 | 11/2013 | Wei et al. |
| 8,884,247 | B2 * | 11/2014 | Miller ............. H01J 37/3056 250/311 |
| 8,920,723 | B2 * | 12/2014 | Damiano, Jr. ......... H01J 37/20 436/805 |
| 9,417,166 | B2 | 8/2016 | Thorne et al. |
| 9,855,557 | B2 | 1/2018 | Thorne et al. |
| 10,241,015 | B2 | 3/2019 | Thorne et al. |
| 11,101,104 | B2 * | 8/2021 | Kuijper .................. G01N 1/42 |
| 11,605,524 | B2 | 3/2023 | Closs et al. |
| 11,653,644 | B2 | 5/2023 | Thorne et al. |
| 12,125,668 | B2 * | 10/2024 | Van Putte ........... B01J 19/0046 |
| 2004/0251412 | A1 | 12/2004 | Tappel |
| 2009/0023155 | A1 * | 1/2009 | Abbott ...................... C08J 5/20 435/7.1 |
| 2009/0143227 | A1 * | 6/2009 | Dubrow ................ D06M 11/46 502/406 |
| 2010/0132483 | A1 | 6/2010 | Thorne et al. |
| 2010/0143198 | A1 | 6/2010 | Damiano, Jr. |
| 2011/0253300 | A1 | 10/2011 | Liu et al. |
| 2011/0253907 | A1 | 10/2011 | Qian et al. |
| 2012/0262190 | A1 * | 10/2012 | Kondo ................... G01N 22/00 324/639 |
| 2013/0138384 | A1 * | 5/2013 | Kong ................ B01D 67/0079 73/31.06 |
| 2013/0277573 | A1 | 10/2013 | Miller |
| 2014/0084157 | A1 * | 3/2014 | Miller ..................... H01J 37/20 250/306 |
| 2014/0203191 | A1 * | 7/2014 | Buijsse ............. G01N 21/6458 250/459.1 |
| 2015/0364294 | A1 | 12/2015 | Wei |
| 2017/0004953 | A1 * | 1/2017 | Glaeser .................... G01N 1/42 |
| 2017/0030626 | A1 | 2/2017 | Closs et al. |
| 2017/0173194 | A1 * | 6/2017 | Kondo ..................... B08B 3/00 |
| 2018/0024032 | A1 | 1/2018 | Hollabaugh et al. |
| 2018/0209881 | A1 | 7/2018 | Arnold et al. |
| 2018/0353881 | A1 * | 12/2018 | Yamamoto ............. C12M 33/14 |
| 2019/0025387 | A1 | 1/2019 | Stautner et al. |
| 2019/0170625 | A1 | 6/2019 | Nijpels et al. |
| 2019/0369014 | A1 * | 12/2019 | White ................. G01N 21/3563 |
| 2021/0066032 | A1 * | 3/2021 | Kuijper .................. H01J 37/22 |
| 2021/0098226 | A1 | 4/2021 | Closs et al. |
| 2021/0195889 | A1 | 7/2021 | Thorne et al. |
| 2021/0310910 | A1 * | 10/2021 | Wang ................. G01N 23/2202 |
| 2021/0310916 | A1 * | 10/2021 | Godfrin .................... G01N 1/42 |
| 2022/0146441 | A1 | 5/2022 | Thorne et al. |
| 2022/0412635 | A1 | 12/2022 | Closs et al. |
| 2023/0255194 | A1 | 8/2023 | Thorne et al. |
| 2025/0076159 | A1 * | 3/2025 | de Ruiter ................ H01J 37/26 |

FOREIGN PATENT DOCUMENTS

| | | |
|---|---|---|
| CN | 109900729 A | 6/2019 |
| EP | 3739615 A1 | 11/2020 |
| EP | 3786608 A1 | 3/2021 |
| JP | 2007139510 A | 6/2007 |
| JP | 2008283892 A | 11/2008 |
| JP | 2008286694 A | 11/2008 |
| JP | 2015187974 A | 10/2015 |
| JP | 2019040871 A | 3/2019 |
| WO | 2016008502 A1 | 1/2016 |
| WO | 2020181215 A1 | 9/2020 |

OTHER PUBLICATIONS

"TEM Grids & TEM Support Films," Ted Pella, Inc. Microscopy Products for Science and industry, Oct. 31, 2013.
The extended European search report for European application No. EP20870953, dated Sep. 28, 2023.
Passmore, "Specimen preparation for high-resolution cryo-EM", MRC Laboratory of Molecular Biology, Cambridge, United Kingdom, Methods in Enzymology, vol. 579, 2016.
International Search Report for international application No. PCT/US20/54272, dated Jan. 27, 2021.
TEM Grids & TEM Support Films, Ted Pella, Inc. Microscopy Products for Science and Industry, Jul. 11, 2018.

* cited by examiner

Fig. 1 (A)  Fig. 1 (B)  Fig. 1 (C)
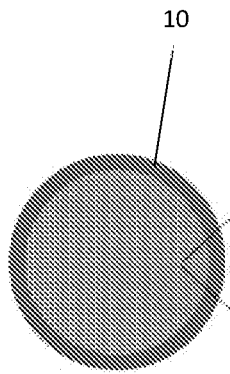
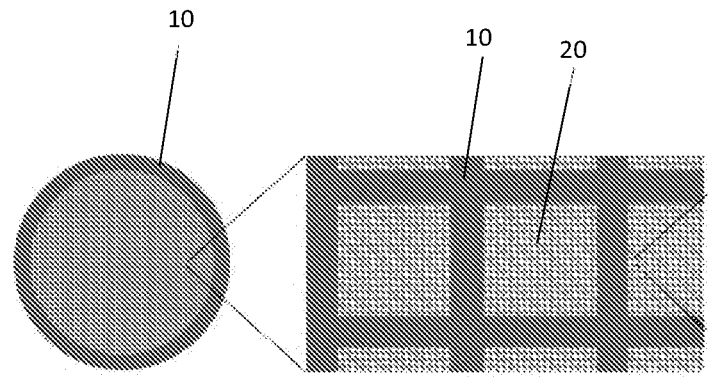
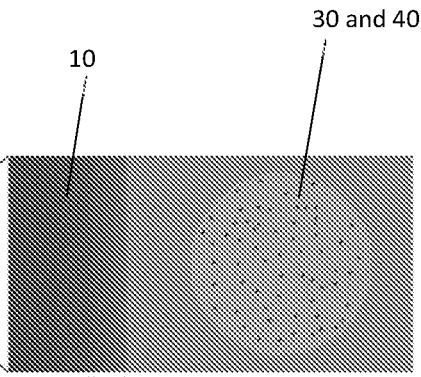
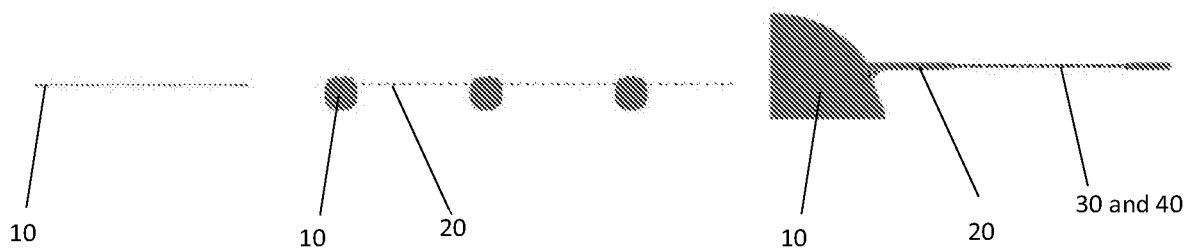
Fig. 1 (D)  Fig. 1 (E)  Fig. 1 (F)
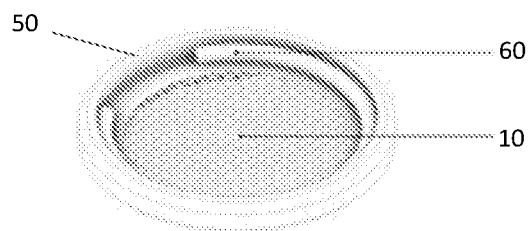
Fig. 1 (G)
(Prior Art)

Fig. 5 (A) (Prior Art)

SAMPLE SUPPORTS AND SAMPLE COOLING SYSTEMS FOR CRYO-ELECTRON MICROSCOPY

CLAIM OF PRIORITY AND CROSS-REFERENCE TO RELATED APPLICATIONS

This application is a U.S. National-Phase Entry of International Patent Application No. PCT/US2020/054272, which was filed on Oct. 5, 2020, and claims priority to U.S. Provisional Application No. 62/910,511, which was filed Oct. 4, 2019, both of which are incorporated herein by reference in their respective entireties and for all purposes.

STATEMENT REGARDING FEDERALLY SPONSORED RESEARCH AND DEVELOPMENT

This invention was made with United States Government support under award number R43 GM137720-01 by the U.S. National Institute of Health (NIH), National Institute of General Medical Sciences (NIGMS). The U.S. Government may have certain rights in the invention.

TECHNICAL FIELD

The present disclosure relates generally to the field of biotechnology. More particularly, aspects of this disclosure relate to sample supports and sample cooling systems for cryogenic ("cryo") electron microscopy (EM).

BACKGROUND

Single-particle cryo-electron microscopy (cryo-EM) is a powerful approach to obtaining near-atomic-resolution structures of large biomolecular complexes, membrane proteins, and other targets of major scientific, pharmaceutical, and biotechnological interest. Development of high efficiency, high frame rate direct electron detectors, algorithms for correcting acquired "movies" for electron-beam-induced motion, and computational tools for classifying and averaging $10^5$-$10^6$ molecular images have dramatically increased achievable resolution and throughput. Enormous investments in new cryo-EM facilities and the development of easy-to-use software have greatly expanded access, especially to non-experts. Unlike X-ray crystallography, cryo-EM requires only a small amount of biomolecular sample dispersed in solution. This enables the structural study of systems that have been intractable to crystallization, and is becoming a go-to method for initial attempts at structure determination.

As in X-ray cryocrystallography, key challenges in single-particle cryo-EM are associated with sample preparation and handling. Basic principles and methods in current use were developed in the 1980s, and recent sample preparation technology development is firmly rooted in ideas and methods developed at that time. In such instances, biomolecule samples must be expressed, isolated, and purified. Cryoprotectant-free buffers containing ~0.3 mg/mL of the biomolecule of interest is dispensed onto glow-discharge cleaned and charged, 10-50 nm thick carbon or metal (often gold) "foil" supported by a 200-400 mesh, 10-25 µm thick, 3 mm diameter metal (usually copper or gold) grid. Excess sample is removed by blotting and evaporation, with a target thickness of several times the biomolecular diameter (e.g., ~10-50 nanometers (nm)) to maximize image quality while limiting the fraction of biomolecules preferentially oriented by interaction with interfaces. To vitrify the buffer for the best imaging, the sample-containing foil+grid is plunged at 1-2 m/s into liquid ethane at T~90 K (produced by cooling gas in a liquid-nitrogen-cooled cup). The sample is transferred from ethane to liquid nitrogen (LN2), loaded into grid boxes, transferred to additional containers and then a storage Dewar. Samples are removed from the storage Dewar and grid boxes and loaded into a cold microscope stage or else "clipped" and loaded into a cold sample cassette; the stage or cassette is then loaded in the microscope.

These complex procedures are fraught with difficulty. Grids and especially foils are routinely bent, torn, and otherwise damaged at each of the many manual handling steps. Sample dispensing, blotting, and evaporation are imprecise. Final sample film thicknesses is poorly controlled. Biomolecules accumulate at interfaces where they may have preferential orientation or undergo denaturation. Plunge cooled samples often develop significant crystalline ice and are contaminated by ice that forms on the ethane, nitrogen, and other cold surfaces exposed to moisture. Instruments in wide use for sample blotting and plunge cooling, notably the VITROBOT™ from FEI, the CRYOPLUNGE™ from Gatan, and the EM GP™ from Leica, do not adequately address these challenges. A new generation of instruments, such as the CHAMELEON™ from TTP LabTech and the VITROJET™ automate the sample preparation process, combining sample dispensing, blotting/wicking, plunge cooling, and transfer to grid boxes. However, these instruments are complex and expensive—roughly $500,000—and require long-term service contracts, putting them beyond the scope of most research groups. More critically, it is not clear that they address key sample preparation challenges in a robust and flexible way.

SUMMARY

Aspects of the present disclosure relate to the design, function, and use of sample supports and sample cooling devices for cryo-electron microscopy.

Presented herein are several innovations in sample support design and sample cooling devices. These innovations may help to simplify sample preparation and handling, dramatically reduce errors and improve outcome reproducibility, and dramatically reduce overall costs.

Sample supports for cryo-EM may include a metal grid that is covered on a top surface thereof by a much thinner sample support film/foil of carbon or metal. In this example, the grid has a mesh pattern of through-apertures and a solid, aperture-free outer edge region. The foil may have a pattern of much smaller through holes. These elements may be handled with metal tweezers with pointed tips.

Aspects of the present disclosure relate to innovations to grids, foils, grid+foil assemblies, and tools for handling grids that may together form a cryo-EM sample holding and handling system, e.g., that will improve functionality and useful throughput.

According to an aspect of the present disclosure, the grid beneath the sample support film has a substantial area—e.g., at least about 10% and less than about 50% of the grid area—on one side where it is solid or nearly solid, e.g., to provide an area where the grid can be safely gripped and handled without damage to the grid or foil. According to an aspect, the grid has one or more indentations in its outer edge that can be used, for example, to precisely orient the grid relative to a matching gripping tool.

According to an aspect of the present disclosure, the grid has a distinct solid area or other structure or marking, located at a smaller radius from the grid's center than the grid's solid outer edge region and at a smaller radius than the inside radius of any grid "clip", which may be used to simplify automated grid handling, and in the region of the grid that is accessible for imaging in the electron microscope, which may allow its orientation about its central axis to be determined during plunge cooling and during subsequent measurement in an electron microscope. This marking may be readily visible to the naked eye.

According to an aspect, the grid has an array of surface marks or through-holes, in the region of the grid away from its edge and any region covered by a "clip" that is accessible for imaging in the electron microscope, that form a pattern or code that can be used, for example, to uniquely identify each individual grid optically or using the electron microscope.

According to an aspect of the present disclosure, the grid bars beneath the sample support film/foil have a reduced width in the plane of the grid within select areas of the grid including less than about 25% or less than about 10% of the total grid area, and that individually include less than about 5% or, if desired, less than about 2% of the grid area. The grid bar width may be reduced to about 1-10 μm from the standard 25 μm or more on 300 mesh grids. The areas of the grid with reduced width may be elongated along the direction of sample motion during plunge cooling as indicated by a gripping area or other feature on the grid that remains visible when the grid is clipped.

According to an aspect of the present disclosure, the grid bars beneath the sample support film/foil have a reduced thickness perpendicular to the plane of the grid in selected areas, e.g., including less than about 25% or less than about 10% of the total grid area. The grid bar thickness may be reduced to about 1 to 5 μm from the standard 10 μm, or about 1 to 10 μm from the standard 25 μm. The areas of the grid with reduced thickness may be elongated along the direction of sample motion during plunge cooling.

According to an aspect of the present disclosure, the grid bar width and/or thickness may be reduced only in small areas comparable to one grid square or cell, e.g., to create weak links where deformation of the grid due to stresses that develop during cooling is concentrated and whose deformation allows substantial motion of the grid bars between them to release stress in the sample support film.

According to an aspect of the present disclosure, the grid has a pattern of apertures and grid bars, and a central region of the grid, may include less than about 25% of the total grid area, has grid bars that have a smaller width, a smaller thickness, and/or a larger mesh size and smaller solid area fraction than in the outer portions of the grid.

According to an aspect, the grid may have both square and hexagonal mesh regions, and may have regions with different mesh sizes and open area fractions.

According to an aspect of the present disclosure, the grid is fabricated from two separate planar and largely circular parts that are bonded together after they are formed. According to an aspect, one part is thicker, and may have one or more holes/apertures that each encompass an area much larger than that of a single grid square (or hexagon). According to an aspect, the thinner part has a grid pattern or mesh that covers the larger holes/apertures in the thicker part.

According to an aspect of the present disclosure, the grid is made of an electrically conductive material, such as molybdenum, titanium, tungsten, and/or tantalum, that has a small average thermal expansion coefficient, e.g., between about 77 K and about 300 K. The sample support foil may be formed from a material that undergoes substantially larger thermal contraction, such as gold, copper, and/or nickel.

According to an aspect of the present disclosure, the sample support film or foil is sized and shaped so that it does not substantially overlap the solid, gripping portion of a grid having a solid, gripping portion, e.g., so that the grid may be gripped on the solid area without contacting or damaging the foil.

According to an aspect of the present disclosure, the foil that covers the grid may have regions with at least two different thicknesses, and one or more of these regions has an array of through-holes.

According to an aspect of the present disclosure, the sample support foil is made of low thermal conductivity but high electrical conductivity metal alloy, which may have a thickness between about 10 and 100 nm or, if desired, about 50 nm, and having holes of size between about 0.1 and 5 μm and or, if desired, about 1 μm, and is placed on a cryo-electron microscopy grid, e.g., made of gold, copper, titanium, nickel, tungsten, and/or molybdenum.

According to an aspect of the present disclosure, the low thermal conductivity, high electrical conductivity alloy is an alloy of chromium and gold with a chromium content between about 0.1% and about 10% by weight or, if desired, about 1% by weight.

According to an aspect of the present disclosure, the metal or carbon sample support foil is continuous and has no holes in regions that form a pattern matching those of the grid bars of the support, and the support foil has arrays of holes in each open area away from the grid bars. According to an aspect, the hole centers are separated from the grid bar locations by at least about ⅛ of the opening width between grid bars.

According to an aspect, the hole-free regions of the sample support foil to be registered with the grid bars may be confined only to select regions of the foil so that the grid bars can be seen below the foil elsewhere and so facilitate alignment of the foil and grid bars.

According to an aspect of the present disclosure, the metal grid and metal foil are fabricated together in a single fabrication process so that they are automatically aligned, rather than in two separate processes that requires an alignment step. According to an aspect, this process involves deposition of a release layer on a substrate; deposition of the foil layer; deposition of photoresist; exposure of the hole pattern of the foil in the photoresist; etching of the hole pattern in the foil; removal of the photoresist; deposition of a second layer of photoresist; exposure and developing of the grid pattern in the photoresist; electroforming the grid onto the foil through openings in the photoresist; removal of the photoresist; and release of the completed grid+foil from the substrate.

Aspects of the present disclosure may further include designs for tools/forceps for holding cryo-EM grids.

According to an aspect of the present disclosure, the tool/forceps may have a sample/grid gripping end having a substantially flat area with a width smaller than but comparable to the 3.05 mm width of the grid.

According to an aspect, the gripping end of the tool/forceps is shaped to contact only the flat gripping area of a grid, and may be structured to prevent contact of the forceps with the foil-covered part of the grid.

According to an aspect of the present disclosure, the gripping end of the tool/forceps may have contours or protrusions that match the outer edge of the grid including any notches in that outer edge, e.g., so that the gripping end slides a fixed distance past the edge of the grip before the grid etch contacts the contours or protrusions and so that the grid is precisely oriented in the forceps. According to an aspect of this disclosure, the grid may have larger through holes in the gripping region that align with posts in a gripping tool.

According to an aspect of the present disclosure, the gripping end of the tool/forceps may be made from a polymer. According to an aspect, the tool/forceps body is made of metal or polymer with a spring action that keeps them either open or closed until squeezed.

Aspects of the present disclosure may also include systems and devices for cooling samples for cryo-electron microscopy, e.g., that do not use ethane or any other flammable liquid cryogen, but instead use only liquid nitrogen for cooling and storage.

According to an aspect of the present disclosure, sample cooling systems/devices may include: a vertical linear sample translation stage that may plunge the sample at a speed of between about 1 and 10 m/s into liquid nitrogen; a gripping mechanism attached to this stage that grips a cryo-EM grid and holds its plane precisely perpendicular to the surface of the liquid nitrogen; a device or means for removing all or substantially all cold gas above the liquid nitrogen surface and ensuring an abrupt (on a scale of 100 µm or less) transition, e.g., between gas at T>273 K and liquid nitrogen at 63 K<T<77 K; where such device/means may include suction/vacuum to remove cold gas and flow of dry ambient temperature gas ($N_2$); a Dewar or insulated container containing liquid nitrogen; and a container residing in the liquid nitrogen into which cryocooled cryo-EM samples are deposited.

According to an aspect, the gripping mechanism automatically releases a cryo-EM grid into a storage container after the grid has been plunge-cooled.

According to an aspect of the present disclosure, a device or means is provided for maintaining the level of the liquid nitrogen in the Dewar nearly constant.

According to an aspect, the sample resides before plunging in a humidified chamber with controllable humidity up to 100%, e.g., to prevent or control sample dehydration.

According to an aspect of the present disclosure, a device or means is provided for automatic or manual blotting of excess liquid from the grid.

According to an aspect of the present disclosure, the Dewar or insulated container containing liquid nitrogen is replaced by a first container containing liquid nitrogen into which the sample is plunged, that is in good thermal contact with a second container that contains liquid nitrogen whose temperature has been reduced below its boiling temperature and towards but not below its freezing temperature, so that the temperature of the liquid nitrogen within the first container is reduced below its boiling temperature.

According to an aspect of the present disclosure, the first container is placed largely inside the second container, e.g., to maximize thermal contact between the first container and liquid nitrogen in the second container.

According to an aspect, the temperature of the liquid nitrogen within the second container is reduced below its boiling temperature by evaporative cooling.

According to an aspect of the present disclosure, the second container may be substantially sealed except for a port that may be connected to a vacuum pump, e.g., to reduce the pressure of the gas in the container and evaporatively cool the liquid nitrogen.

According to an aspect, a mechanical stage within the main liquid nitrogen chamber accepts standard cryo-EM sample holder storage boxes/cassettes and automatically positions them in line with the sample plunge path defined by the vertical translation stage, e.g., so that each cold sample may be deposited into a separate compartment in each holder through a combination of vertical-only motion of the vertical translation stage and horizontal-only motion of the mechanical stage on which the sample holder storage boxes are placed.

Aspects of this disclosure also include systems, devices, and suitable means for removing excess sample solution from the surface of the grid and foil prior to plunge cooling.

According to an aspect of the present disclosure, absorbent material, such as filter paper, is cut to substantially match the size and area of a cryo-EM grid.

According to an aspect of the present disclosure, this absorbent disk is pressed directly into contact with the surface of the grid.

According to an aspect of the present disclosure, this absorbent disk is embossed or patterned to produce raised areas, e.g., so that only the raised areas make contact with the grid when the absorbent disk is pressed into contact with the grid.

According to an aspect of the present disclosure, the raised areas on the absorbent disk occupy only a small fraction, e.g., less than about 25% or about 10%, of the total area of the grid, so that most of the grid area is not contacted by the absorbent disk.

According to an aspect, the sample support foil on the grid has a pattern of regions with holes and no holes that match the embossed pattern on the absorbent material, e.g., so that the regions of the foil that are contacted by the absorbent material have no holes.

Aspects of the present disclosure may also include systems, devices, and means for cooling cryo-EM samples using a cryogenic liquid, such as liquid ethane and/or liquid nitrogen, where one or more jets of cryogenic liquid are directed at a sample, and where a device or means is provided to prevent precooling of the sample by cold gas that precedes the cryogenic liquid from its jet tube or nozzle.

According to an aspect of the present disclosure, the device/means may include: a sample holder that holds at least one cryo-EM grid; a supply of liquid cryogen in an insulated container; one or more tubes or conduits coming from the insulated container through which the liquid cryogen flows, and from which the liquid cryogen emerges and flows as a jet toward the sample; a device or means for propelling the liquid cryogen from the container and through the tube toward the sample; and a device or means for eliminating cold gas ahead of the cryogenic liquid jet, e.g., so that the sample cooling begins only when the liquid jet impinges on the sample.

According to an aspect of the present disclosure, the device or means for propelling the liquid cryogen from the container may include a piston, a pump, or pressurized gas present in the container.

According to an aspect, the liquid cryogen is prevented from flowing out the tube or conduit to the sample by a valve.

According to an aspect of the present disclosure, the sample may be stationary relative to the axis (axes) of the conduit portion(s) that generates the liquid cryogen jet(s) as the liquid cryogen flows toward the sample.

According to an aspect of the present disclosure, the sample may be translating relative to the axis (axes) of the conduit portion(s) that generates the liquid cryogen jet(s) as the liquid cryogen flows toward the sample.

According to an aspect, a mechanical shutter or blade initially blocks the liquid cryogen stream when it first begins flowing from the conduit toward the sample, and then is rapidly moved out of the way so that the liquid cryogen stream strikes the sample.

According to an aspect, the shutter includes a thermally insulating material.

According to an aspect of the present disclosure, a high speed stream or "blade" of gas at a temperature between 0° C. and ambient temperature is directed across the outlet of the tube that generates the liquid cryogen stream, e.g., so that cold gas that emerges from the tube ahead of the liquid is deflected away from the sample.

According to an aspect of the present disclosure, a device or means for translating samples after cooling into a container of liquid nitrogen is provided.

According to an aspect of the present disclosure, the samples are translated into a grid cassette or other grid holder than is held within liquid nitrogen or cold nitrogen gas within an insulated container.

The above Summary is not intended to represent every embodiment or every aspect of the present disclosure. Rather, the foregoing summary merely provides an exemplification of some of the novel concepts and features set forth herein. The above features and advantages, and other features and attendant advantages of this disclosure, will be readily apparent from the following detailed description of illustrated examples and representative modes for carrying out the present disclosure when taken in connection with the accompanying drawings and the appended claims. Moreover, this disclosure expressly includes any and all combinations and subcombinations of the elements and features presented above and below.

BRIEF DESCRIPTION OF THE DRAWINGS

FIG. 1 (A) is a top view of a commercially available cryo-EM grid covered with a sample support film or foil and sample.

FIG. 1 (B) is a top view of a commercially available cryo-EM grid covered with a sample support film or foil and sample.

FIG. 1 (C) is a top view of a commercially available cryo-EM grid covered with a sample support film or foil and sample.

FIG. 1 (D) is a side view of a commercially available cryo-EM grid covered with a sample support film or foil and sample.

FIG. 1 (E) is a side view of a commercially available cryo-EM grid covered with a sample support film or foil and sample.

FIG. 1 (F) is a side view of a commercially available -EM grid covered with a sample support film or foil and sample.

FIG. 1 (G) is a perspective view of a commercially available cryo-EM grid that has been "clipped" for automated handling.

FIG. 2 (B) is a perspective view of a biomolecule-containing liquid sample flows through holes in the foil and wet to the grid bars.

FIG. 3 (B) is a perspective view of a Grid design with a solid area and notch for gripping and orientation marking, and bar coding or marking for grid identification and tracking.

FIG. 4 (B) is a perspective view of a grid as that includes an orientation notch and a gripping region.

FIG. 5 (B) is a perspective view of a cryo-EM grid according to one embodiment with variable grid bar width and geometry in select areas. The arrows indicate the direction of grid motion relative to the liquid cryogen during plunge cooling.

FIG. 5 (C) is an enlarged perspective view of the cryo-EM grid in FIG. 5 (C) according to one embodiment showing selected areas with reduced width and removed grid bars.

FIG. 8 (B) is a perspective view of the bottom part of cryo-EM grid that is fabricated in two parts that are aligned and bonded together, according to one embodiment.

FIG. 10 (B) is a perspective view of the bottom grid gripping element of the forceps, according to an embodiment.

FIG. 10 (C) is a perspective view of the bottom grid gripping element of the forceps, according to an embodiment.

FIG. 13 (B) is a perspective view of an embodiment of a cryo-EM sample cooler similar to that in FIG. 12 that incorporates a warm dry gas stream to deflect cold gas emerging ahead of the liquid jet away from the sample, according to aspects of the present disclosure.

FIG. 14 (B) is a top and section views of a blotting disk cut from absorbent material and embossed to produce surface relief, to match the grid design in (A).

Figure 2:
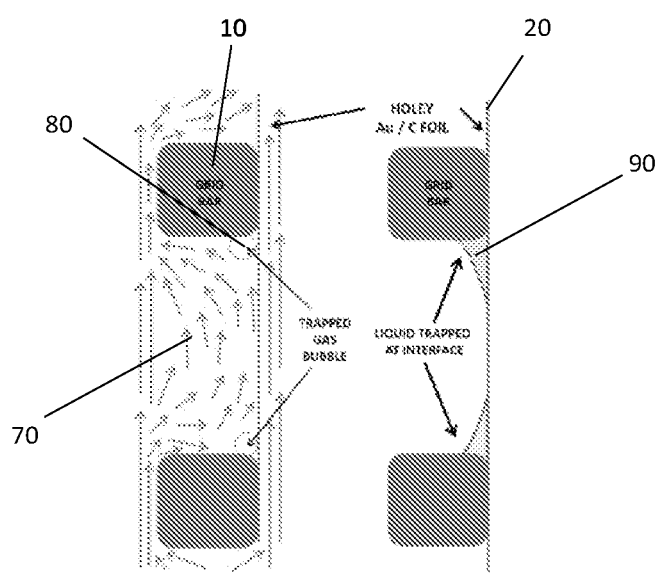
FIG. 2 (A) is a perspective view of one cell of a 300 mesh cryo-EM grid covered with a thin sample support foil. Arrows indicate flow of liquid cryogen.

The present disclosure is amenable to various modifications and alternative forms, and some representative embodiments are shown by way of example in the drawings and will be described in detail herein. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed, for example, by the appended claims.

DETAILED DESCRIPTION

This disclosure is susceptible of embodiment in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Introduction, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example.

Some representative goals of this work include developing tools including sample supports, sample handling tools, and cooling instruments that allow reliable vitrification of cryo-EM samples, reduce rates of grid and foil damage, and facilitate automated sample tracking.

Scientific Motivation

The current generation of cryo-EM sample supports and cooling devices are based in large part upon research and principles developed in the 1980s. Since then there has been significant progress in understanding the physics of cooling of small samples using liquid cryogens, particularly in the context of cryocrystallography; in understanding the physics of ice formation; and in our ability to design and fabricate complex structures at reasonable cost. These advances enable the design and implementation of improved sample preparation technologies to address critical bottlenecks in biomolecular structure determination using cryo-EM. We outline some key concepts and challenges motivating some of the concepts below.

Cooling rates required for vitrification of cryo-EM samples are approximately 220,000 K/s. Critical cooling rates (CCRs)—the minimum cooling rates required for sample vitrification—depend on the maximum tolerable or detectable ice fraction in otherwise vitrified samples. By extrapolating measurements of CCR vs solute concentration for diverse solutes to zero concentration, the CCR of pure water has been established as 250,000 K/s (for a crystalline ice fraction determined by X-ray methods below ~1%). CCRs decrease exponentially with solute concentration, but solutes decrease electron density and EM contrast. CCRs are 220,000 K/s for the ~0.5% w/v salt concentrations typical of cryo-EM buffers.

Cooling rates achieved in current cryo-EM practice are far below theoretical limits. Despite using liquid ethane, one of the most effective liquid cryogens, and despite the modest cooling rates required to vitrify water, samples for single-particle cryo-EM often exhibit substantial areas of crystalline ice. For a 3 mm diameter sample composed of 50 nm of water on 50 nm of gold or 12 nm of carbon and plunged edge-on into liquid ethane at ~90 K at 2 m/s, our approximate analytic analysis of heat transfer based on the boundary layer approximation predicts cooling rates of ~$10^7$ K/s. Calculated cooling rates using LN2 in the nucleate boiling regime (beginning once the sample temperature has dropped below ~140 K) are comparable to those in liquid ethane; and even plunging through $N_2$ gas at 100 K should give cooling rates of ~200,000 K/s, sufficient to vitrify cryo-EM sample films. For a 30 μm diameter water sample plunged at 2 m/s, the predicted cooling rate in liquid ethane is ~300,000 K/s, comparable that measured using a 30 μm bead thermocouple. Since crystalline ice is commonly observed in cryo-EM, sample cooling rates must often be well below 200,000 K/s.

Current cryo-EM grids are not optimized to deliver the fastest possible cooling rates. Cryo-EM sample supports consist of a thin film or foil—of holey carbon, amorphous carbon, gold, graphene or another material—on a metal (copper, gold, molybdenum, nickel, among other materials) grid. The sample support film/foil typically has holes of size of order 1 μm, and the sample is imaged through these holes. Grid diameters are 3.05 mm and thicknesses range between 10 μm and 25 μm. The grids be stiff enough for manual handling using, e.g., tweezers or forceps, and they not be bent or damaged during handling or plunge cooling into liquid ethane. For 300 mesh grids, popular in single-particle cryo-EM, the grid bars are typically 25 μm wide and separated by 58 μm, and cover ~50% of the total grid area. For a gold or copper disk 3 mm in diameter and 5 μm thick (the average thickness of a 300 mesh grid) plunged at 2 m/s into liquid ethane, the calculated cooling rate is ~$10^5$ K/s. Crystalline ice formation is expected, and a 3-5 μm wide (and often much wider) region of crystalline ice adjacent to grid bars is routinely observed.

Cryo-EM sample buffers (typically water plus ~0.5% salt) and carbon (holey, amorphous) have very low thermal conductivities. For ~50-100 nm thick amorphous carbon films, calculated heat transfer rates during plunge cooling from Au/Cu grid bars to the film at the center of each grid opening are ~1% of the calculated heat transfer rates from the film to ethane. Consequently, the film at the center of each grid opening is thermally isolated from the grid bars, and—provided liquid cryogen flows and boundary layers are uniform—can cool at much faster rates.

However, several factors complicate this picture. First, ~50 nm gold foils (on gold grids) are increasingly popular because they reduce beam-induced sample motion. Gold's thermal conductivity is ~$10^3$ that of amorphous carbon, and calculated heat transfer from the grid bars and through the foil is comparable to heat transfer from the foil to the ethane, compromising sample cooling rates.

Second, sample flows through holes in the support foil during dispensing and blotting and accumulates on the backside of the foil where, because of the projecting grid bars, blotting is more difficult. Substantial sample can be pinned where the gap between foil and grid bar is small. Water absorbs roughly the same amount of heat per unit volume on cooling from ~300 K to ~90 K as Au or Cu, and has much lower thermal conductivity. Extra thermal mass and thermal insulation provided by adhered sample substantially reduces sample, foil, and grid bar cooling rates.

Third, the substantial thickness and small spacing of grid bars produces complex fluid flows and may lead to gas trapping/entrainment adjacent to grid bars on the back side of the grid, reducing cooling rates.

Finally, grids are often bent (e.g., like tacos) and foils buckled and damaged in routine handling using forceps, complicating ethane flows and likely resulting in nonuniform sample cooling.

Large temperature differences between grid bars and the sample+foil during cooling may contribute to sample motion during irradiation. Sample motion during irradiation is a major factor limiting the achievable resolution in single-particle cryo-EM. Motion occurs even during low-dose exposures, and is most rapid (on a per dose basis) at the beginning of irradiation, when radiation damage is modest and the highest-resolution structural information is available. If signal to noise is sufficient, sample "movies" can be analyzed to correct for motion and improve final resolution. Bare supports undergo substantial beam-induced motion, due to stress/strain caused by differential contraction during cooling of the support and grid materials. This motion is minimized by using the same material (e.g., Au) for both. For sample spanning the foil's holes, the primary mode of motion corresponds to "doming" of the sample film (like a drum-head); for 1.2 µm diameter holes, the radiation-induced displacement of the sample perpendicular to the plane of the foil was ~150 Å, and had a curvature radius of 25 µm.

These observations suggest that sample motion arises from radiation-induced creep driven by sample stress: as creep proceeds, the driving stress is released and the creep rate drops. Sample stress can be generated by differential contraction of the sample and foil support during cooling. Between room temperature and water's glass transition temperature $T_g$~136 K the sample volume expands by ~8%, but the sample is liquid so this expansion is uncoupled from the foil's contraction. Below $T_g$, vitrified water has a positive thermal expansion coefficient (comparable to that of hexagonal ice), but sample contraction is now coupled to that of the supporting foil. Cooling-induced sample stress can then be reduced by matching the expansion coefficients of vitreous ice and the foil between $T_g$ and 77 K, the final storage temperature. Amorphous carbon, copper, and gold foils all contract less than vitreous ice in this temperature range, with gold's contraction providing the best match. All will produce tensile stress in the sample, for example. However, radiation-induced creep in the presence of tensile sample stress will not cause the observed doming.

Stress driving radiation-induced sample motion likely arises in part due to transient temperature differences between the grid bars and the sample+foil during cooling. Because the foil is so much thinner and less mechanically stiff than the grid bars, its contraction will largely be determined by the contraction of the grid bars. Since the grid bars cool and contract more slowly than the foil between them, the foil develops transient tension. The sample vitrifies on and rigidly attaches to this tensile-stressed foil. As the grid bars cool toward the final temperature of the foil+sample, their separation decreases and the tension in the foil is released, placing the sample under compressive stress. In the foil holes where the sample is unconstrained by the foil in its relaxation, irradiation-induced creep will then generate "doming" to release this stress. The observed "doming" of height ~150 Å in a 1.2 µm diameter foil hole could result from a temperature difference between grid bars and foil at the time of sample vitrification of as little as 20 K.

Current cryo-EM cooling instruments are complicated to use and are not optimized to deliver the fastest possible cooling rates. Cold gas above a liquid cryogen precools samples as they are plunged through it. For plunge speeds of ~1 m/s, a cold gas layer only ~2 cm thick dominates cooling of protein crystals smaller than ~500 µm. Most cryo-EM cooling instruments plunge the sample into a small cup containing liquid ethane that is surrounded by a larger cup of liquid nitrogen. The ethane level is at least a few millimeters below the top of its cup, guaranteeing a cold gas layer of at least this thickness. Using the calculated cooling rate for a 3 mm diameter, 50 nm thick sample in cold $N_2$ gas of ~200,000 K/s, a sample plunged at 2 m/s will travel only 1.6 mm through this gas before cooling below $T_g$~136 K— a distance smaller than the cold gas thickness. Consequently, cooling of sample and foil between grid bars may largely occur in the cold gas, before the sample reaches the ethane. Variability in gas layer thickness and the fraction of cooling it provides may contribute to variability of observed outcomes.

Cryo-EM samples can also be cooled by spraying a stationary sample with jets of liquid ethane, as in the VitroJet™. Cold gas generated in the ethane jet tubes is pushed out ahead of the liquid and similarly precools the sample.

Sample supports for single-particle cryo-EM that facilitate efficient vitrification using either liquid ethane or liquid nitrogen, minimize beam-induced sample motion, simplify sample handling and tracking, and facilitate diagnosis of sample preparation issues. FIGS. 1 (A-F) (from Russo and Passmore, Current Opinion in Structural Biology 37, 81-89 (2016)) illustrate the design of current sample supports used in cryo-EM. The rigid base of the sample support is a metal "grid" 10, 3.05 mm in diameter, 10-25 µm thick. The grids are typically of copper or gold, but may also be of molybdenum, nickel, titanium, or other material. The grid has a solid border surrounding a mesh of holes (typically 40 to 200 µm in size, depending on mesh size and open area fraction) with 200, 300, and 400 mesh grids being most popular. Th grid is covered with a film or "foil" 20 of holey carbon, amorphous carbon, gold, or other electrically conducting material having a thickness in the range 10-50 nm, or by a layer of graphene. This foil has an array of holes 30 typically of size 0.5-2 µm. An aqueous buffer containing the biomolecule to be imaged is placed on the foil, and excess liquid removed to produce a sample film 40 between ~10 and 100 nm thick. The sample is imaged in the holes in the foil. Cryo-EM grids are "clipped" (FIG. 1 (G)) to render them more amenable to automated handling. The grid 10 is placed in the ring-shaped support 50, and springy metal clip 60 is inserted so as to hold the grid in firm contact with the support 50. The support 50 has an outside diameter of 3.51 mm, an inside diameter of 2.49 mm, and a thickness of 0.40 mm.

FIG. 2 (A) shows how cryogenic fluid 70 flows around grid 10 when the grid is plunged into a liquid cryogen. For a typical 300 mesh cryo-EM grid, the grid bar thickness (25 µm) is a few times smaller than the separation between grid bars (58 µm), so the grid bars perturb liquid cryogen flow across the back side of the foil. Gas bubbles 80, entrained when the grid passes through the gas-liquid cryogen interface or generated via boiling of the liquid cryogen at the grid surface, may become trapped between the support foil and grid bars and decrease cooling rates there. FIG. 2 (B) shows how sample solution pushed through holes in the foil during blotting may wet the grid bars and accumulate beside them, decreasing cooling rates there.

Figure 3:
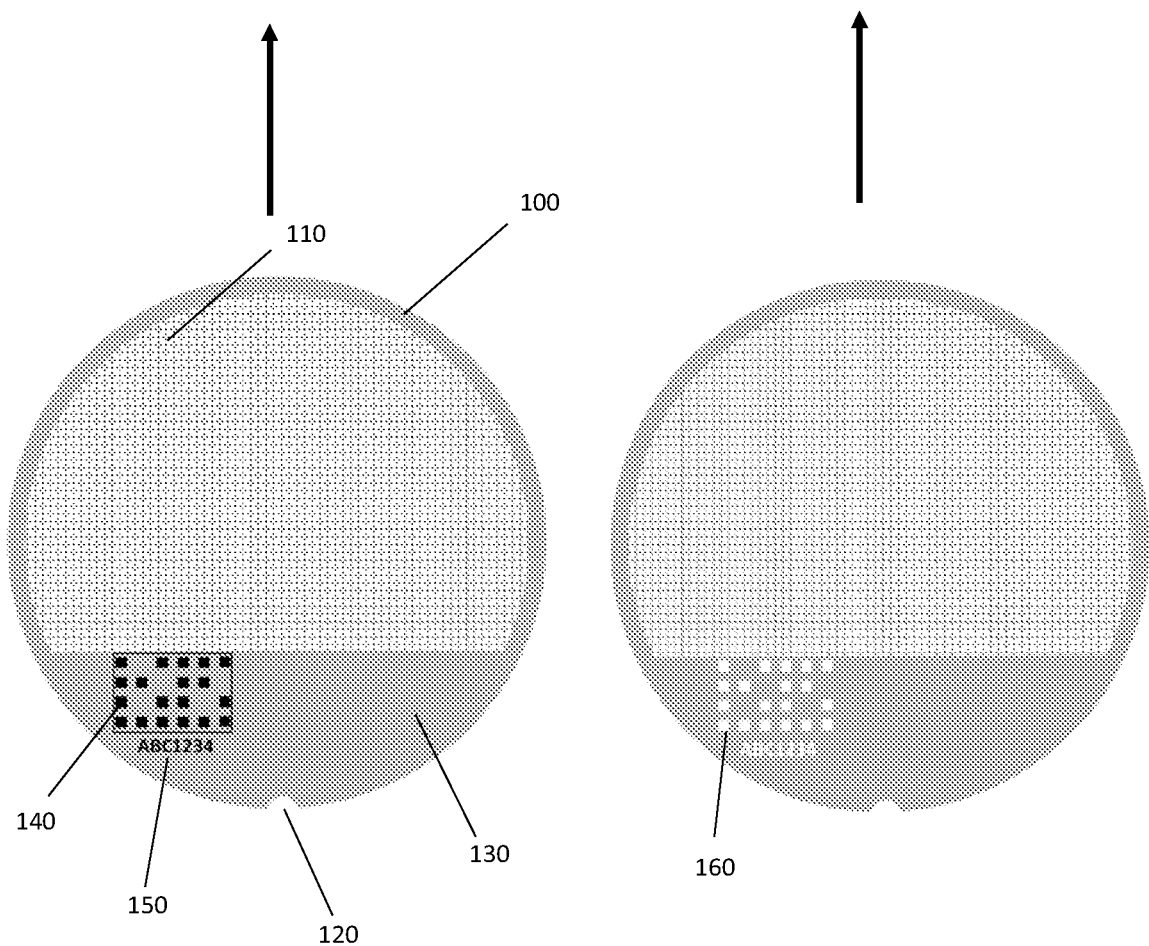
FIG. 3 (A) is a perspective view of a Grid design with a solid area and notch for gripping and orientation marking, and bar coding or marking for grid identification and tracking.

Orientation marking with a gripping/handling region. FIG. 3 shows grids 100 in accordance with aspects of the disclosed concepts. Grids used in single-particle cryo-EM (e.g., Quantifoil™, C-flat™) have simple symmetric mesh patterns, covered over their entire area by a foil and can be easily bent or damaged. In FIG. 3 (A), the grid 100 has a mesh of holes 110 over which the sample supporting foil is placed. The grid has a notch or other indented feature 120 on one edge, a solid area on one side 130, and a mark 140 and an alphanumeric code 150 patterned on the solid area that uniquely identifies each grid. The identifying patterns can be generated using, e.g., a laser or ink jet/dot matrix printing. In FIG. 3 (B), the grid is marked by forming holes 160 through the grid. The identifying marks are located within the inner edge of the "clip" in FIG. 1 (G), and so can be read optically and in the electron microscope.

A solid area on one side of the grid may facilitate gripping with forceps, tweezers, or using forceps with gripping surfaces matched to the flat area and to the curve of the grid, reducing risk of grid deformation. If the foil does not appreciably overlap this solid area, for example, the risks of foil damage during grid handling will be reduced.

Notch 120 and solid area 130 allow the grid to be oriented during a plunge into liquid cryogen and its orientation to be determined in the electron microscope. During plunge cooling, fluid flows, the thermal boundary layer thickness, and heat transfer rates vary with position on the grid, particularly along the direction of the plunge path. With a dedicated gripping area, the grid orientation during plunge cooling will be fixed, so EM inspection of ice character versus position along and perpendicular to the plunge direction can be used to characterize heat transfer across the grid, to optimize grid and cooling instrument design, and to speed identification of grid regions with well vitrified sample.

Only a handful of grid squares are needed to collect complete data sets. Cooling rates should be largest near the leading edge of the grid where the thermal boundary layer is thinnest. Consequently, a substantial fraction of the grid area can be sacrificed for the gripping region. A potentially desirable plunge direction is indicated in FIG. 3 by arrows.

Figure 4:
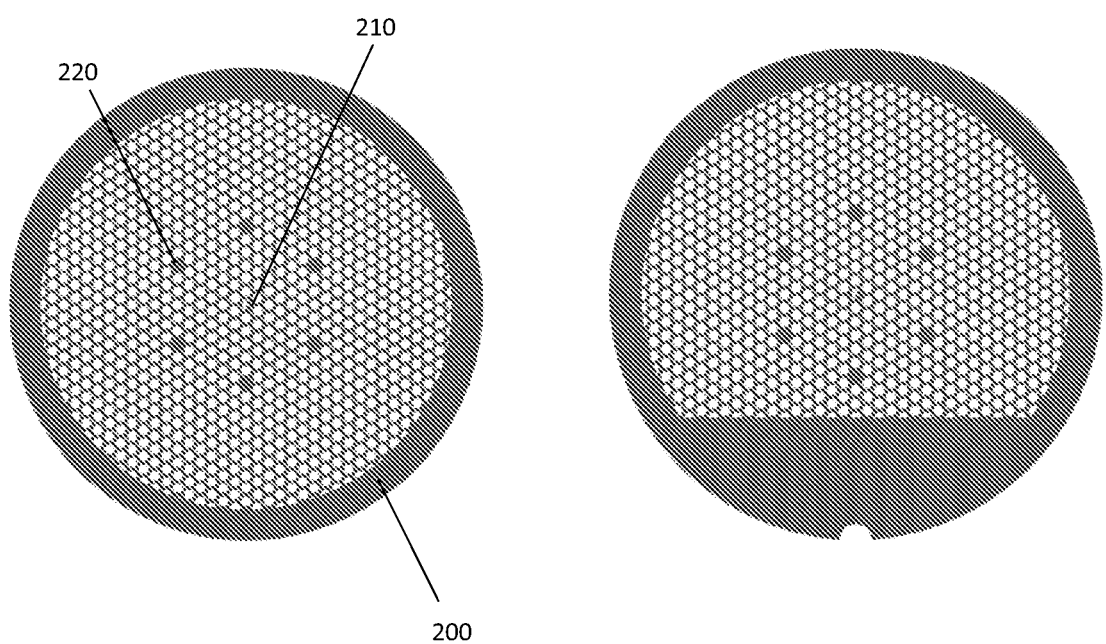
FIG. 4 (A) is a perspective view of a Cryo-EM grid according to an embodiment having a hexagonal mesh of holes, a set of solid, hole-free regions, and an asymmetric feature or marking.

FIG. 4 (A) shows an alternative grid 200 configuration with a hexagonal mesh of holes. The grid has an asymmetric mark or feature 210 located with the grid region that remains visible once clipped. This mark, a feature of some existing grids, allows grid orientation —rotationally about a central axis perpendicular to the plane of the grid, and also which side of the grid is facing upward—to be determined using the electron microscope and optically using a magnifier or optical microscope. The grid has a set of solid, hole-free regions 220 one or several grid units in size, that can be laid out in an asymmetric pattern to assist visual orientation of the grid. FIG. 4 (B) shows a similar grid with a solid gripping region and a notch.

Bar coding for sample tracking. The flat gripping area in FIG. 3 or the smaller solid areas 220 in FIG. 4 can be patterned with a unique identifier for each grid. These can be photographed in the cooling instrument prior to cooling, verified during EM imaging, and used to track individual grids using spreadsheets or an laboratory information management system (LIMS). The grids could be marked individually after fabrication, so that every manufactured grid had a unique marking. Alternatively, there could be a finite number of distinct markings, encoded in the photomask used in fabrication. Roughly 2000 grids with individual markings can be fabricated from a single 6" mask. This finite set of marks combined with grid carriers equipped with bar-code and/or cryogenic RFID tracking capabilities could be sufficient for robust sample tracking.

Grid patterns that reduce thermal gradients and increase sample thermal and mechanical isolation during cooling. Current grids used in single particle cryo-EM have uniform thicknesses of 10 μm (Au) or 18-25 μm (Cu, Mo). Overall grid thickness cannot be reduced significantly without compromising mechanical rigidity during manual handling and clipping. But since only a small fraction of the grid area is sufficient for structure determination, the grid bar thickness and/or width can be substantially reduced in selected areas away from the "clipped" grid periphery to increase grid bar cooling rates, and reduce grid bar stiffness to allow more deformation in response to differences in contraction between the grid bar and foil during cooling. Since the grid orientation during plunge cooling can be fixed, the grid bar patterns where thickness is reduced can be arranged to form "lanes" for laminar liquid cryogen flow and maximum heat transfer rates from the sample and foil.

Figure 5:
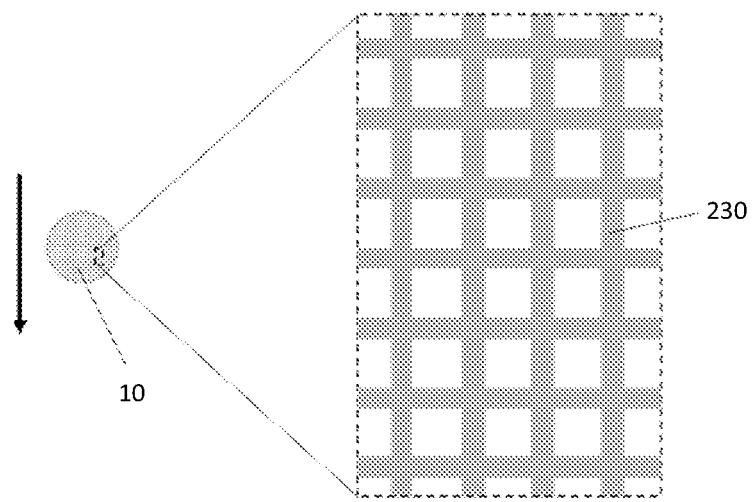
FIG. 5 (A) is a perspective view of a commercially available cryo-EM grid and a close up of its grid bar pattern.
Figure 5:
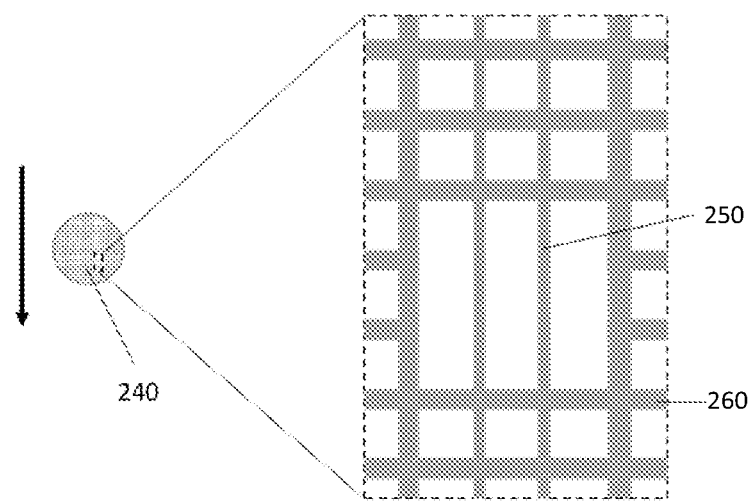
Figure 5:
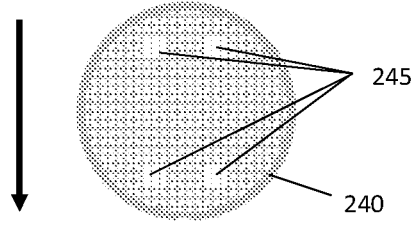

FIG. 5(A) shows a standard cryo-EM grid 10 where grid bars 230 have uniform thickness and width and the grid openings have a fixed size. FIG. 5(B) shows a representative grid 240 in which, in regions of the grid including at least 4 grid squares, the grid bars 250 have a reduced width, and where the horizontal grid bars 260, i.e., those oriented parallel to the liquid cryogen surface during a plunge, may be removed. The reduced width reduces grid bar heat capacity and thermal conductance in these areas. This should increase grid bar cooling rates and reduce the temperature difference between grid bars and the sample+foil during cooling with liquid cryogens. The areas of reduced grid bar width may be elongated along the direction of sample motion during plunge cooling, so as to reduce flow perturbations by grid bars and improve heat transfer. The areas where grid bars have reduced width and/or are removed should be placed, sized, and structured in a way as to not appreciably degrade the overall mechanical stiffness and robustness of the grid, or increase beam-induced sample motion on the foil. The total area of the modified grid may be less than about 25% or, if desired, less than about 10% of the total grid area, and the individual modified areas may include less than about 5% or, if desired, less than about 2% of the grid area.

Figure 6:
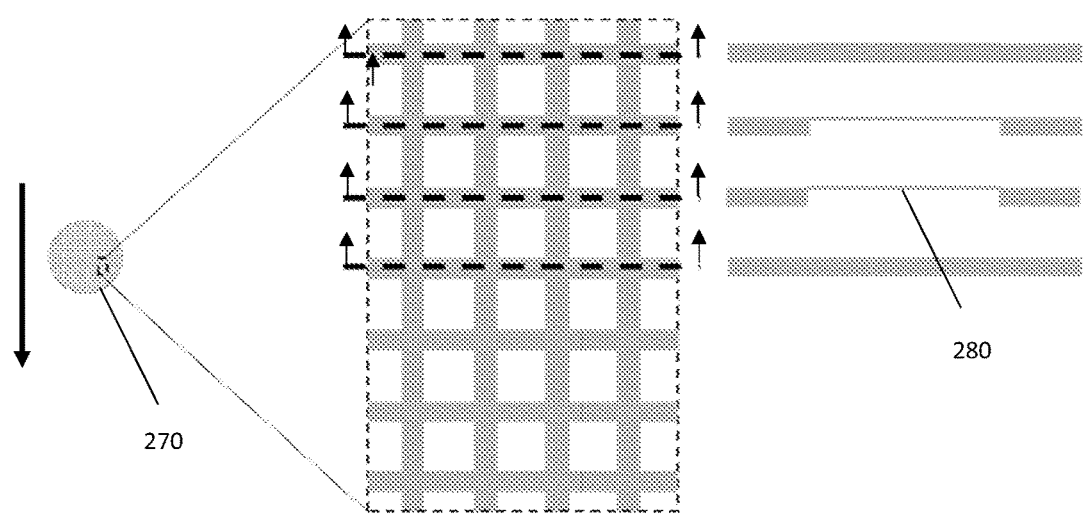
FIG. 6 is a perspective view of a cryo-EM grid according to one embodiment in which, in selected regions of the grid area, the grid bars have a reduced thickness perpendicular to the plane of the grid.

FIG. 6 shows an example of a cryo-EM grid 270 in which, in selected regions of the grid area including at least 4 grid squares, the grid bars 280 have a reduced thickness perpendicular to the plane of the grid. The reduced thickness reduces grid bar heat capacity and thermal conductance, and reduces perturbations of liquid cryogen flow and trapping of gas by grid bars during plunge cooling. This should increase grid bar cooling rates and reduce the temperature difference between grid bars and sample+foil during cooling in liquid cryogens. Grid areas with reduced thickness may be elongated along the direction of sample motion during plunge cooling. The areas of the grid with reduced thickness should be placed, sized, and structured in a way as to not appreciably degrade the overall mechanical stiffness and robustness of the grid when handled at its edges or in a region designed for grid gripping.

Figure 7:
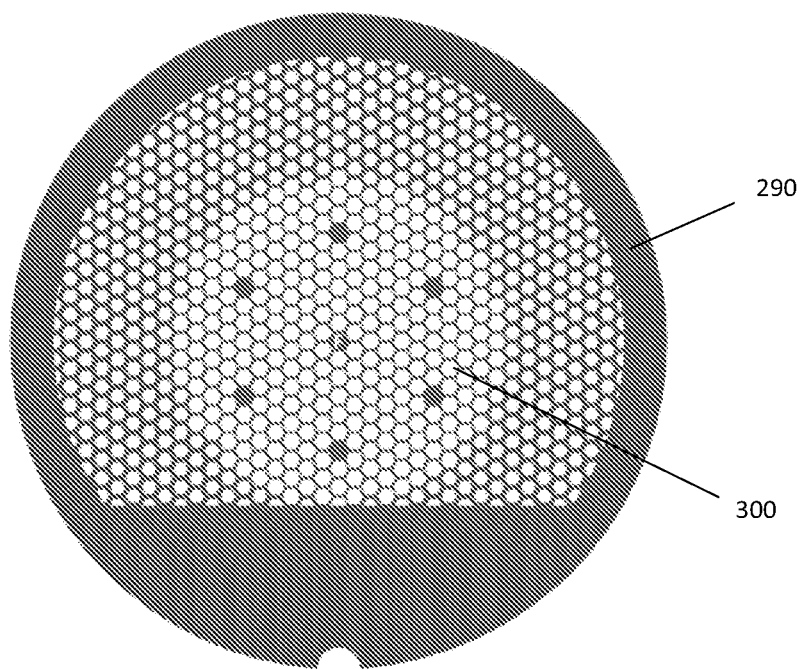
FIG. 7 is a perspective view of a cryo-EM grid according to one embodiment in which, in one or more selected regions of the grid, the grid pattern has a larger mesh size and/or larger open area fraction than in surrounding regions.

FIG. 7 shows another example of a cryo-EM grid 290 in which, in one or more regions of the grid, the grid pattern has a larger mesh size and/or narrower grid bars than in surrounding regions. Grid bars in the selected areas should cool more rapidly. Large mesh openings will increase the fraction of the sample+foil located away from the grid bars (e.g., at least 10 µm away). These regions of the sample+foil cool faster making vitrification more likely. The surrounding more mechanically robust portion of the grid will facilitate grid handling without damage. In FIG. 7, the grid has hexagonal patterns of apertures and grid bars, and the central region's area is approximately 25% of the grid's area. A circular, centrally located region of modified grid layout 300 minimizes anisotropic grid stresses that may develop during cooling.

Figure 8:
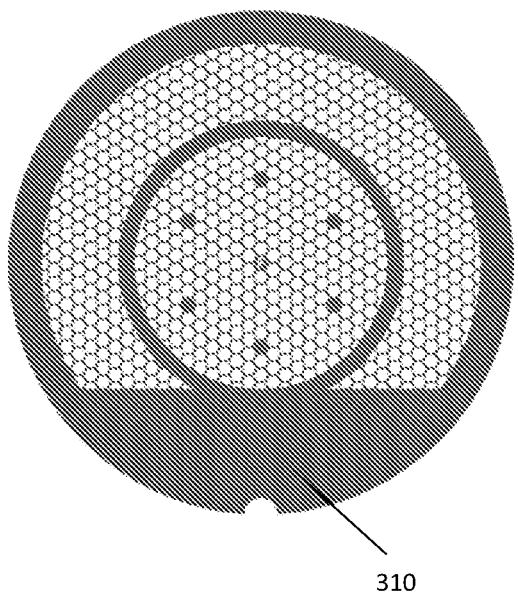
FIG. 8 (A) is a perspective view of the top part of cryo-EM grid that is fabricated in two parts that are aligned and bonded together, according to one embodiment.
Figure 8:
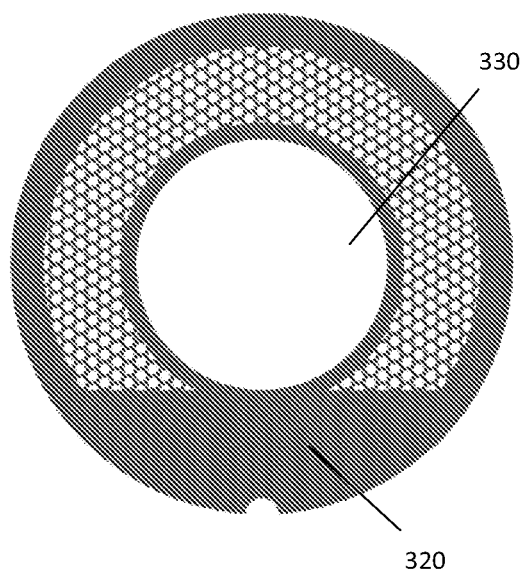

Cryo-EM grids are typically fabricated using electroforming, which deposits a layer of metal of uniform thickness onto a mandrel. A multi-thickness grid could be manufactured by performing multiple steps of photoresist deposition, patterning, and electroforming, or by bonding together two separately electroformed grids. FIG. 8 shows a cryo-EM grid that includes a top grid 310, onto which the sample support foil is placed, and a bottom grid 320 having a different thickness and complementary pattern. The top and bottom are separately fabricated and then bonded together. The bottom grid 320 may have an aperture 330 so that the thickness of the bonded grid within the hole is just that of the top grid. The resulting composite grid can then have regions of very different thickness and that cool at very different rates, while maintaining mechanical rigidity. The two grids can be of the same material to ensure thermal contraction matching, or of different materials if, e.g., the goal is for the top grid to be under tensile stress when cold.

Grids used in single-particle cryo-EM are typically made of Cu or Au, and are covered by foils made of amorphous carbon or Au. For instance, the grid is made of an electrically conducting material that has a smaller average thermal expansion coefficient between 77 K and 300 K than the foil material. W, Mo, Ta, and Ti grids may all have small thermal expansions coefficients (4.3, 5, 6.5, and 9 ppm/° C., respectively) while Au, Cu and Ni have substantially larger expansions (14, 16, and 13 ppm/° C., respectively). With this combination, faster cooling of the sample+foil relative to the grid bars does not result in vitrified sample developing a net compressive stress at the final sample temperature (between 77 K and 120 K) that may drive beam-induced sample motion. During cooling, the sample remains liquid to near its glass transition temperature $T_g$~136 K. Once it vitrifies, further cooling of sample+foil makes both want to contract, but initially they are constrained in doing so because the grid bars are warmer and have contracted less, and because grid bars are much stiffer than the sample+foil. The grid bars contract as they cool toward the final temperature, reducing the tensile stress in the foil, and this may place sample on top of the foil into compression. By minimizing thermal contraction of the grid material, and making its overall contraction from room temperature to low temperature much smaller than that of the foil, the sample+foil will remain under tension during cooling. The thermal contraction of the grid material between room temperature and 77 K may be comparable to or smaller than the thermal contraction of the foil material between 136 K and 77 K, and is comparable to or smaller than the thermal contraction of amorphous and hexagonal ice between 136 K and 77 K. This is approximately true for Au foil and Ti, W or Mo grids. Doped Si grids contract very little—much less than any metals—and also satisfy this criterion, but are too fragile at the required thicknesses.

Foil materials and patterns for optimal sample cooling, optimal imaging, and minimal sample motion. Using Au foil on Au grids reduces overall differential contraction of foil and grid on cooling from 300 K to 77 K. The thermal contraction of Au between water's glass transition temperature $T_g$=136 K and 77 K roughly matches that of vitreous ice, but its large thermal conductivity may conduct too much heat from the grid bars and hinder vitrification of sample on the foil between them. To thermally isolate the sample+foil from the grid bars while retaining the attractive thermal expansion properties of Au, foils can be fabricated from an alloy of gold and chromium. For example, a Au—Cr alloy with 1% Cr has roughly 1/10 the thermal conductivity of Au but similar electrical conductivity at 77 K. Other alloys (e.g. Au—Pt at concentrations of 1-5% Pt) reduce thermal conductivity while maintaining good electrical conductivity. Other low thermal conductivity, high electrical conductivity alloys may be suitable.

The liquid sample often wets through holes in the foil to the grid bars during sample deposition and/or blotting. This increases thermal mass in the vicinity of the grid bars and decreases cooling rates there. The fluid flow and wetting will, once the liquid solidifies, rigidly attach the foil to the grid and strongly couple their contraction during cooling, which may create stresses in the sample that cause electron beam-induced sample motion. By eliminating the fluid contacting foil and grid, the foil may be free to slide over the grid bars during cooling.

Figure 9:
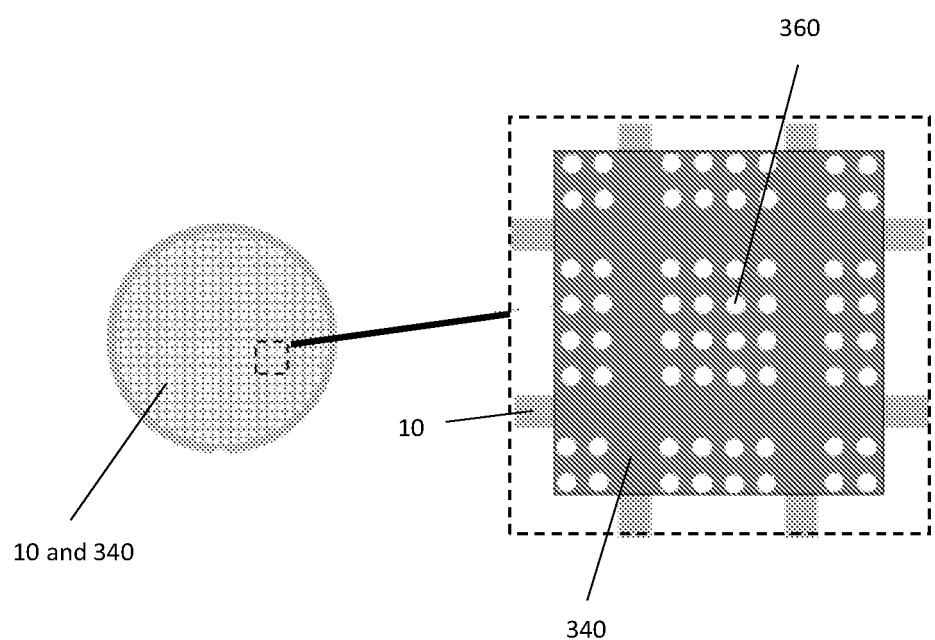
FIG. 9 is a perspective view of a thin metal or carbon sample support foil on a grid. According to an embodiment, the foil has no holes where it overlaps the grid bars, but has arrays of holes within the areas enclosed by the grid bars.

One way to reduce liquid sample flow and wetting to grid bars is to use a foil that is hole-free directly above and in the vicinity of the grid bars. In FIG. 9, the grid 10 has a foil 340 that has no holes where it overlaps the grid bars, and arrays of holes 360 within areas enclosed by the grid bars. The gap between the edge of the grid bar and the nearest hole in the foil should be at least 5% of the separation between grid bars or a few hole diameters to minimize the chance of liquid that may bulge through the holes wetting the grid bars.

The foil may have fiducials or other marks to facilitate alignment of the foil and grid so that the solid areas of the foil line up with the grid bars. The hole-free regions to be registered with the grid bars may be confined only to select regions of the foil, so that the grid bars can be seen below the foil elsewhere and so facilitate alignment of the foil and grid bars.

The foil that covers the grid can have multiple different hole sizes between 0.2 and 5 µm, distributed across its area. This diversity of hole sizes may yield a diversity of ice thicknesses and cooling rates that may facilitate obtaining optimal imaging conditions.

The foil that covers the grid can be fabricated with regions having two or more different thicknesses, where one or more of these regions has an array of through-holes. The hole thickness determines the ice thickness when the sample has been properly blotted. Having two thicknesses on the same foil can increase the chance of obtaining an optimal sample thickness for imaging. The outer periphery of the foil can be made substantially thicker than the rest to simplify foil handling and placement on the grid. A foil with thickness that steps up at increasing radii could be fabricated by using disk-shaped shadow masks of increasing radius during successive depositions of metal or carbon. The innermost foil region would then be thinnest, and the outer periphery thickest. The shadow masks could be fabricated using standard photolithographic and etching processes from, e.g., 1 mil thick Cu foil, or from a photo-exposable polymer like SU-8 or polyimide. The disks for a foil array must be connected by thin lines. Shadowing by these lines can be reduced by using different line positions on successive masks, or by placing the mask in near contact and depositing the metal or carbon from an angle.

The metal grid and metal foil can be fabricated together in a single fabrication process so that they are automatically aligned, rather than in two separate processes that requires an alignment step. This process could involve deposition of a release layer on a substrate; deposition of the foil layer; deposition of photoresist; exposure of the hole pattern of the foil in the photoresist; etching of the hole pattern in the foil; removal of the photoresist; deposition of a second layer of photoresist; exposure and developing of the grid pattern in the photoresist; electroforming the grid onto the foil through openings in the photoresist; removal of the photoresist; and release of the completed grid plus foil from the substrate.

Figure 10:
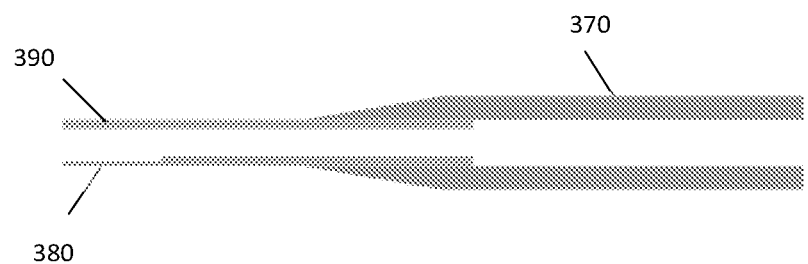
FIG. 10 (A) is a perspective view of a forceps for gripping and handling cryo-EM grids without damaging them according to an embodiment.
Figure 10:
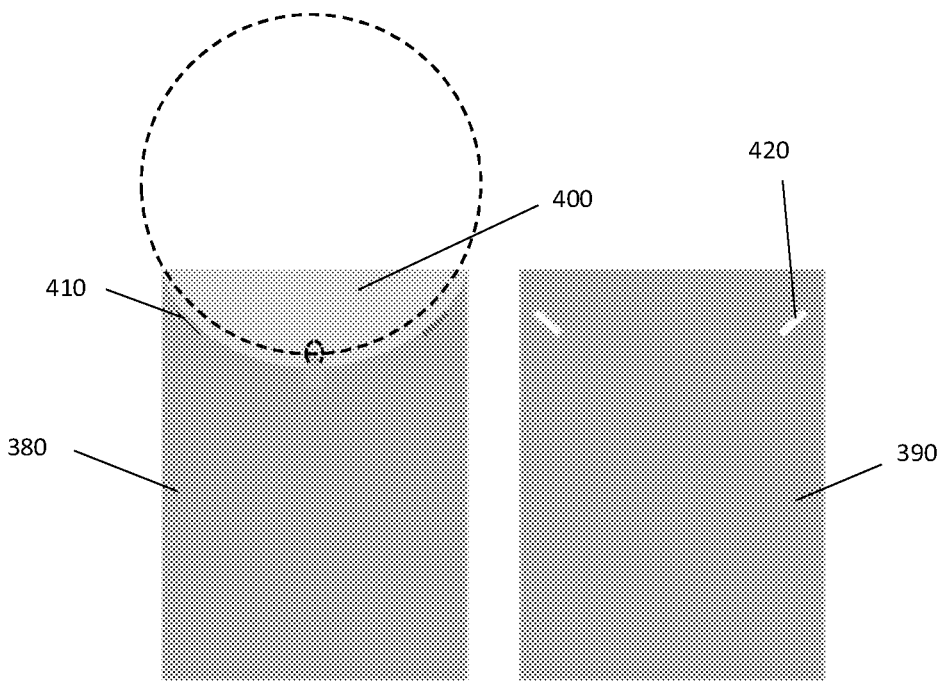

Tools for handling grids. Aspects of the present disclosure may include designs for tools/forceps for handling cryo-EM grids without damaging them. Standard pointy-tipped stainless steel forceps can damage the foil if the tips impact the foil, if the grid is bent via contact with, e.g., a surface so that the foil impacts the tip, or if the tip's grip slips. Because the tips are much narrower than the grid, bumping the side of the grid into, e.g., the slot of a grid storage box bends it into a "taco" shape. In an example shown in FIG. 10, the sample end of forceps 370 with spring action (either normally open or normally closed when not being squeezed, depending upon whether the two arms of the forceps are largely straight or cross over so that the "bottom" tip is connected to the arm that is on top at the squeezing end) has gripping elements 380 and 390 attached to each arm near their tip. These gripping elements are flat on their inner face in the portions that grip the grid, and their width may be comparable to, e.g., within ±20% of, the diameter of the grid (3.05 mm). This width will help to minimize the risk of the grids being bent by forces applied to their side while being held. The gripping elements can be structured to "mate" to the grid so that the elements only contact a certain portion of the grid, e.g., the solid region on the lower portion of the grids in FIG. 3. For example, the lower gripping element 380 may have a thinned or recessed region 400 (perhaps with an aligning "nose") that matches the profile/contour of the grid. This recessed region should ideally be slightly shallower than the grid thickness, typically either 10 or 25 μm. The lower grid element may also have protrusions 410, with matching holes 420 in the upper gripping element 390, to help position the grid relative to the gripping elements and prevent the grid from slipping past the recessed region 400, while allowing the forceps to be closed onto and firmly grip the grid.

The forceps body/arms may be of metals like stainless steel conventionally used in forceps, or of a polymer. The gripping elements may be of metal with a smooth (perhaps polished or electroplated) inner surface to minimize risk of abrasion and damage to the foil, of a polymer, or of a bendable glass or ceramic. The forceps gripping elements need only extend a small distance—a few millimeters—past the end of the arms of the forceps. Consequently, the gripping element can be of a thin, somewhat flexible and optically transparent polymer like polyimide, PDMS, or COC, allowing the grid's position within the gripping elements to be directly seen. The more rigid but opaque polymer SU-8 could also be suitable. These polymers can be processed into the desired shapes—and with the required micrometer-level tolerances on thickness—using standard photolithography-based microfabrication methods. Other polymers suitable for injection molding can also be used. The grid gripping elements may be attached using a cryogenic compatible adhesive, ultrasonically, using screws, or by other standard means to the jaws of standard spring-loaded metal or polymer forceps. Note that these forceps may be usable both at room temperature and when grids are immersed in liquid ethane and liquid nitrogen.

Benchtop plunge cooling system for reliable vitrification of cryo-EM samples using only liquid nitrogen. Since Dubochet's work in the 1980s, almost all cryo-EM sample cooling devices have used liquid ethane (or ethane/propane) held just above its melting point as the cooling medium. Flammable ethane gas must be stored in the lab, liquified by flow into cups cooled by liquid nitrogen (LN2), and then cooled to and maintained at the desired temperature; plunge cooled samples must be transferred through air into liquid nitrogen for storage and transport; and remaining liquid ethane evaporated and safely vented. In the current generation of plunge cooling instruments, the ethane and nitrogen are exposed to room air so that moisture condenses as frost and contaminates both and the grids that are plunged and stored in them.

Current cryo-EM sample cooling rates are limited by grid designs and by precooling in cold gas above the liquid ethane. Moreover, the choice of ethane has been based in part on incorrectly interpreted and extrapolated measurements using large thermocouples indicating a factor of 20 cooling rate advantage over LN2. In fact, for small samples (protein crystals and cryo-EM grids), the cooling rate advantage of liquid ethane is at most a factor of ~3, which can easily be compensated for by proper cooling instrument and grid design. MiTeGen developed NANUQ™, an instrument for high-throughput cryocooling using LN2 and automated storage of samples for protein crystallography. It delivers cooling rates for 30 μm thermocouples in excess of 50,000 K/s and 140,000 K/s in the film and nucleate boiling regimes, respectively. In commercial use, it has dramatically simplified sample cryopreservation and storage. This performance is achieved by combining a high-speed sample translation stage, a gas management manifold that uses vacuum and warm make-up gas to remove and replace cold gas above the LN2 immediately prior to sample plunging, and a precision liquid nitrogen level control system. These components reduce the cold gas layer (where the gas temperature is below 273 K) to <50 μm, the time for sample precooling in this cold gas to <25 μs, and deliver the largest cooling rates ever reported using liquid nitrogen. Proof of principle experiments using NANUQ™ have demonstrated that thin buffer solution samples on cryo-EM grids can be fully vitrified using LN2 as the cooling medium.

Figure 11:
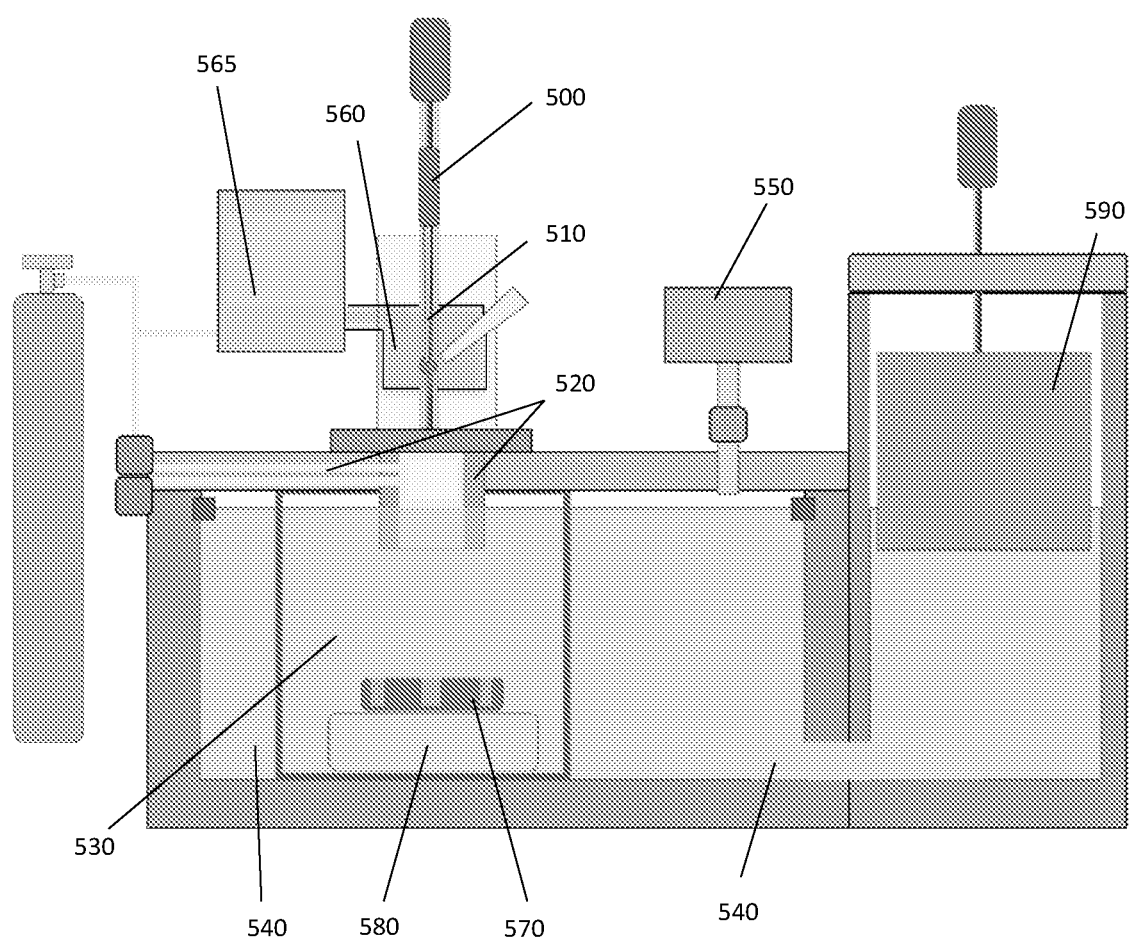
FIG. 11 is a perspective view of a conceptual design of a liquid-nitrogen-only plunge cooler for cryo-EM samples.

FIG. 11 shows a representative design for an LN2-based benchtop cryo-EM plunge cooler that eliminates manual grid handling between plunging and microscope loading. The small mass and impact cross-section of cryo-EM grids compared with protein crystal sample holders allows the vertical translation stage 500 to delivers speeds up to 7 m/s (and perhaps 10 m/s), which should double cooling rates compared with NANUQ™. The grid holding mechanism 510 holds grids absolutely perpendicular to the LN2 surface to maximize cooling rates and minimize foil damage, and may automatically release the grid into a storage container after plunge-cooling. The grid holding mechanism may have minimal hydrodynamic cross-section over a length of at least several centimeters along the plunge direction, as larger plunge speeds may require substantially larger stopping distances (which may make them impractical when using liquid ethane).

As in MITEGEN's® commercially available NANUQ™, the plunge cooler incorporates a gas management manifold 520 above the main plunge chamber, which removes cold gas present in its plunge bore via suction and replaces it with ambient temperature nitrogen gas, so as to create a transition between ambient temperature gas and liquid nitrogen over a distance of less than 100 µm, eliminating precooling of the grid in the cold gas.

To reduce waves associated with boiling on the LN2 surface that degrade cold gas layer removal, and to improve cooling performance by allowing some absorption of heat by the LN2 before it vaporizes, LN2 in the main sample plunge chamber 530 is cooled below its boiling point 77 K through thermal contact with a second (thermally insulated) chamber 540 in which LN2 is evaporatively cooled toward its freezing temperature of 63 K. This second chamber is be sealed from the atmosphere, and connects via a port to a vacuum pump 550 or other vacuum source to lower the pressure in the gas above the LN2 in the second chamber.

The initial sample position is within a humidified chamber 560 or within a humidified gas stream. The humidity control system 565 may generate humidities up to within at least a few percent of 100% saturation to allow control over the amount of sample evaporation from the grid.

After plunge cooling, the grids may be automatically deposited into a commercial electron microscope cassette or other holder 570 held within the main plunge chamber. In an example, a mechanical stage 580 under automated control is provided within the main chamber that accepts commercial cryo-EM microscope cassettes or custom storage boxes and automatically positions them in line with the sample plunge path defined by the vertical translation stage, so that each cold sample may be deposited into a separate compartment in each holder through a combination of vertical-only motion of the vertical translation stage and horizontal-only motion of the mechanical stage on which the sample holder storage boxes are placed.

The LN2 level in both the main plunge chamber and the outer chamber is precisely maintained using a level control system as in the NANUQ™.

Figure 12:
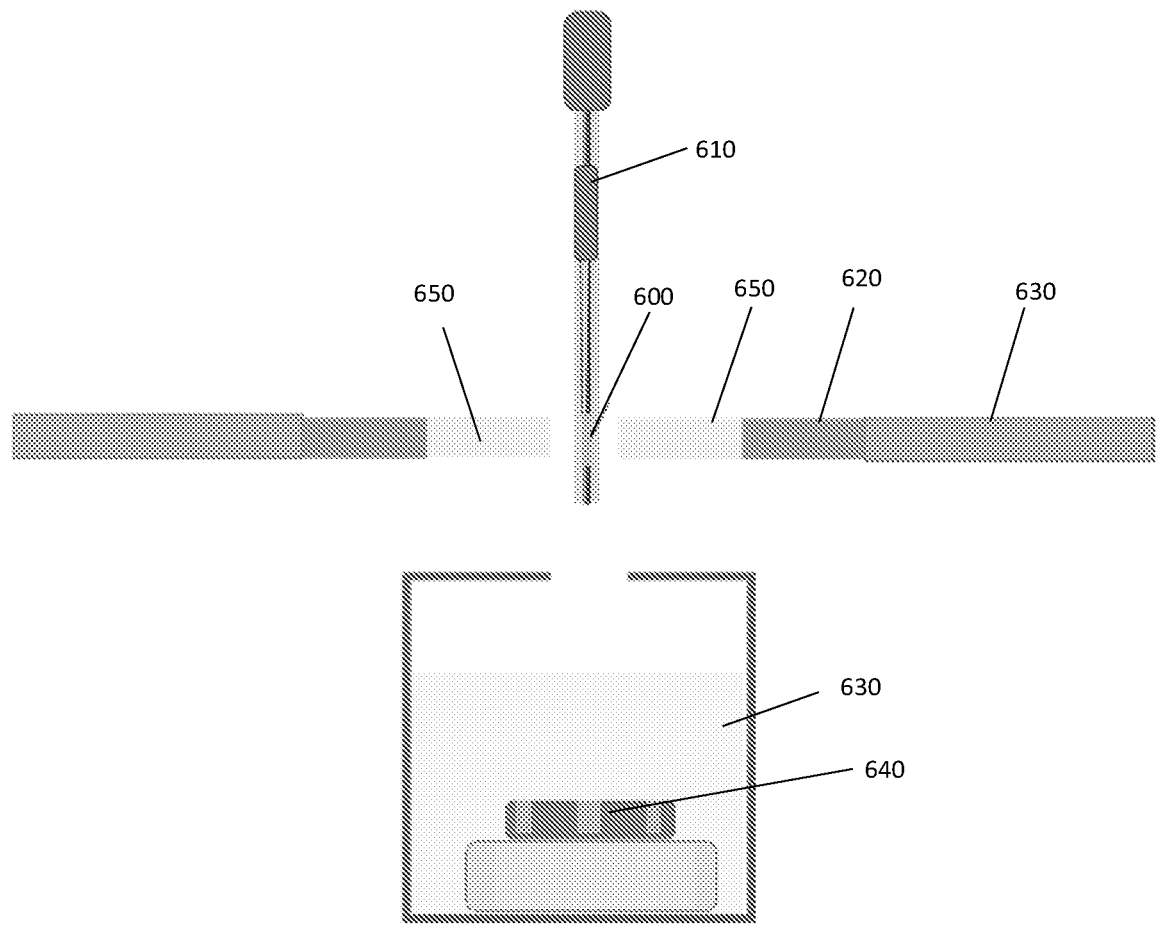
FIG. 12 is a perspective view of an alternative cryo-EM sample cooler design in which the sample grid is held on a translation stage, and jets of liquid cryogen are directed at the sample to cool it.

Improvements on cooling of cryo-EM samples using jets of cryogenic liquid FIG. 12 shows an alternative, commercially available cryo-EM sample cooler design. In this design, the cryo-EM grid sample 600 is translated via an automated translation stage 610 from an initial position, typically within a humidified chamber (not shown), to an intermediate position. It is then cooled by one or more jets 620 of a liquid cryogen—usually liquid ethane—that exit tubes or conduits 630 (which may have a nozzle at the exit end). Once cold, the sample is quickly translated into an insulated container 630 containing liquid nitrogen, and then into a storage box or cassette 640. The advantage of this approach is that grids can be "clipped" before cooling, because the liquid cryogen will not be blocked by the clips on its way to the sample support foil as occurs when clipped grids are plunged into liquid cryogen. However, when the jet of cryogen flow is first initiated toward the sample, cold gas 650 present in the tubes/nozzle or generated via contact with the liquid cryogen will exit the conduits ahead of the liquid cryogen. When the distance between the conduit output and the sample is small, this cold gas will reach the sample first, precooling it at a much slower cooling rate than is obtained when the cryogenic liquid finally lands on the sample. At cooling rates provided by the liquid cryogen, it takes only about 0.4 milliseconds for the sample to cool from room temperature to near 100 K. With typical jet speeds of 5 m/s (limited by the impact force on the grid and foil), the liquid travels only 2 mm in that time—or about half a grid diameter. Cold gas present in the tubes cools the sample at a rate, based on an analysis by Kriminski et al., that is perhaps 20 times smaller than that of the cryogenic liquid. Consequently, 4 cm of cold gas will be sufficient to cool the sample to near 100 K, and this cooling will occur at a smaller rate that may not yield vitrified ice.

Figure 13:
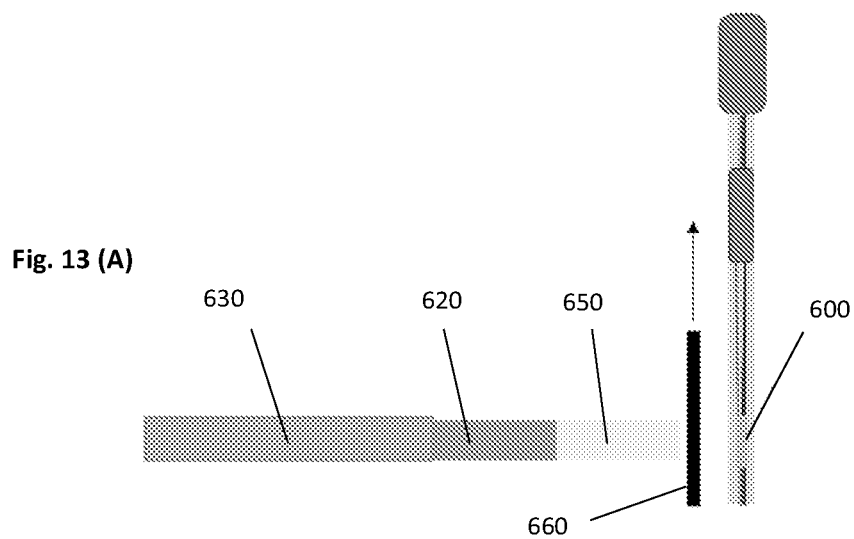
FIG. 13 (A) is a perspective view of an embodiment of a cryo-EM sample cooler similar to that in FIG. 12 that incorporates a shutter to block cold gas and liquid cryogen, according to aspects of the present disclosure.
Figure 13:
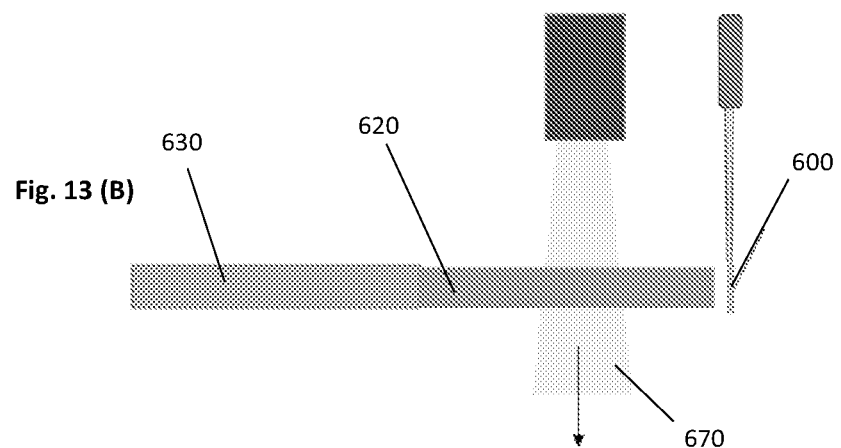

FIG. 13 shows two representative examples that may help to address problems associated with cold gas precooling of the sample in cryogen jet coolers of the type shown in FIG. 12, by preventing it from reaching the sample. In the first example shown in FIG. 13(A), the cold gas 650 that emerges from the jet tube 630 ahead of the liquid cryogen 640 is prevented from reaching the sample by using a very fast shutter or blade 660. The shutter initially blocks the gas and cryogen flow and then abruptly moves out of the way as soon as the cold gas has cleared and a steady cryogen flow against the shutter has been established. The shutter can have linear or rotational motion, driven by, for example a stepper or synchronous motor, a solenoid, compressed gas, or other standard means. The time for the shutter to move a distance equal to the jet diameter—a few millimeters—should be comparable to or less than the sample cooling time of <1 ms, corresponding to a speed of at least a few meters per second, in order that the whole grid be hit by the jet. The shutter may be made of a thermally insulating material such as a polymer, a glass (e.g., quartz), or a ceramic, has a small mass, and has sufficient thickness so that the sample is not precooled by conductive, convective or radiative cooling arising from a cold shutter during the short time between initiation of the liquid cryogen flow and the opening of the shutter.

In a second example shown in FIG. 13(B), a jet or "blade" of moisture-free room temperature gas is directed across the flow from the jet tube, and has a flow velocity large enough to sweep away the cold gas but small enough that the path of the liquid cryogen (which has much more momentum) from jet tube to sample is not excessively perturbed. This warm gas flow can be turned on before the liquid cryogen jet is activated, and turned off once the sample is cold. The warm gas could be directed downward as shown, or upward, away from the insulated container in which the cold sample is to be stored. The gas could be dry air, $N_2$, He, or any other non-flammable, non-reactive gas with a boiling temperature above the freezing temperature of the liquid cryogen. The gas could come from a compressed gas cylinder or other compressed gas source.

Improvements in removing excess liquid from grids via blotting. In single-particle cryo-EM, biomolecules in an aqueous buffer are deposited on the sample support foil on a grid. The volume of sample initially deposited is typically 0.1-1 milliliters, and the resulting drop extends a fraction of a millimeter above the foil surface. This must be reduced to a thin film roughly 50 nm thick that spans the holes in the foil, in order to obtain adequate image contrast in the electron microscope. Excess sample is removed using a combination of evaporation in a controlled humidity environment (which leads to concentration of the biomolecule in the remaining liquid) and blotting using an absorbent material, typically filter paper (e.g., as made by Whatman.) Both are imprecise and hard to control. Blotting can be performed manually by gently touching the grid using a thin strip of filter paper. Commercial cryo-EM cooling instruments like the VITROBOT™ from Thermo Fisher use circles of blotting paper several centimeters in diameter on pads that are pushed with controlled force and for a controlled duration at an angle against one or both sides of the grid. The angled attack of the blotting paper allows liquid to be withdrawn from one side of the grid, which helps reduce forcing of liquid through the foil holes to the backside of the foil where the grid bars make it harder to remove.

According to aspects of the present disclosure, blotting of cryo-EM grids is performed using small disks comparable to or slightly larger in diameter to a grid, of absorbent material that may have a pattern of surface relief. These disks are attached to solid disk-shaped pads attached to a rod, and the rod is moved so that the disks are always parallel to the plane of the grid. As a disk moves toward the foil and grid, liquid is first wicked away by the raised areas of the disk when they first make contact with the liquid meniscus. As the disk is pressed into direct contact with the foil, liquid continues to be drawn sideways toward the raised regions of the disk that make contact. At the same time, the disk material is soft, so as the pressure is increased the relief of its surface is reduced, further assisting in removal of excess liquid. As a result, provided the approach of the disk to the grid is not too fast, liquid can be efficiently removed without being pushed through holes in the foil to the backside of the foil. Furthermore, because the absorbent disk is pressed flat against the grid, it effectively seals it from the surrounding air, preventing evaporation of the liquid. As a result, the removal of liquid can be more finely controlled.

In an aspect of this disclosure, the absorbent material is cut to substantially match the size and area of a cryo-EM grid. If the grid is to be blotted while held with, e.g., forceps in a plunge or jet cooler, the absorbent disk can have a cut-out so that it does not contact the forceps, and so that it can be pressed flat against the portion of the grid that is not covered by the forceps.

In an aspect of this disclosure, the absorbent material is filter paper, which is available in many grades from suppliers such as Whatman.

Surface relief of the filter paper can be created by embossing, which involves pressing the filter paper against a master with sufficient force that the master's pattern is transferred to the filter paper. Typical Whatman filter paper has a thickness of 180 μm, and this roughly limits the spatial scale on which surface relief can be patterned. To achieve finer patterning, the filter paper can be wet before embossing. It can also be shredded in, e.g., a blender with water, pressed into a master, and then dried.

In another example, the sample support foil on the grid has a pattern of holes that is complementary to the raised regions of the absorbent disk, so that the foil is continuous where the filter paper contacts the foil and has holes elsewhere. This will further reduce the chance of liquid being pushed through holes in the foil to its backside.

Figure 14:
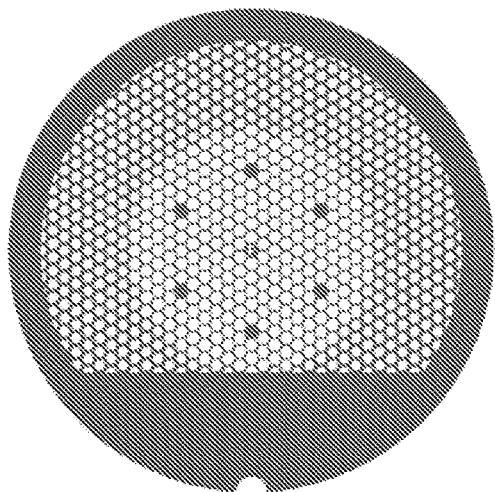
FIG. 14 (A) is a perspective view of a cryo-EM grid according to one embodiment.
Figure 14:
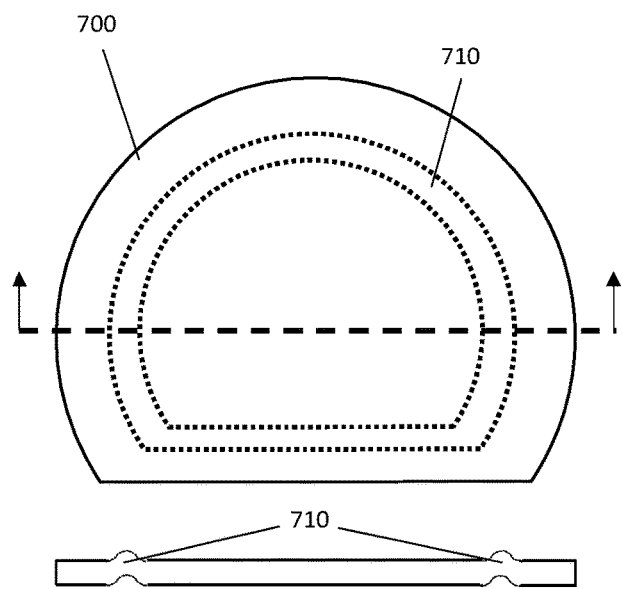

FIG. 14(A) shows a cryo-EM grid (covered with a foil not shown), according to one aspect of the present disclosure, that has a solid gripping region and a central region with a larger open area fraction and smaller grid bar width. FIG. 14(B) shows top and cut-away side views of an absorbent disk 700, cut to avoid the gripping area of the grid. The grid is embossed to generate a raised region 710 around the outer portion of the mesh area.

Additional features may be reflected in the following clauses:

Clause 1: a sample support device, comprising: a grid having a first surface, a second surface, a grid thickness, an inner portion, and an outer portion, the inner portion including a plurality of grid bars oriented to form a plurality of holes through the first and second surfaces in between the grid bars, the plurality of holes having a first diameter; a solid region accessible for imaging in an electron microscope, the solid region including an array of surface marks arranged in a pattern or code configured to uniquely identify the grid; and a sample support film in contact with the first surface of the grid, the sample support film having a film thickness less than the grid thickness, the sample support film also having a plurality of apertures extending through the sample support film and including a second diameter smaller than the first diameter of the plurality of holes in the grid.

Clause 2: the sample support device of clause 1, wherein the grid is configured to be gripped by a gripping tool of a cryo-EM system, and wherein the outer portion of the grid includes an indentation configured to orient the grid with respect to the gripping tool.

Clause 3: the sample support device of clause 2, wherein the gripping tool includes a gripping end with a contour or protrusion, and wherein the indentation receives therein the contour or protrusion so as to orient the grid relative to and within the gripping tool.

Clause 4: the sample support device of clause 1, wherein the outer portion of the grid has a circular shape making up between about 10% and about 50% of the grid.

Clause 5: the sample support device of clause 4, wherein the grid is configured to be gripped by a gripping tool of a cryo-EM system, and wherein the outer portion also includes a semi-circular gripping area, the gripping area having a straight edge in communication with the inner portion of the grid and configured to orient the grid relative to the gripping tool.

Clause 6: the sample support device of clause 5, wherein the sample support film is sized and shaped to not substantially overlap the gripping area of the grid.

Clause 7: the sample support device of clause 1, wherein the grid bars include a first grid bar having a first width and a second grid bar having a second width.

Clause 8: the sample support device of clause 1, wherein the grid bars include a first grid bar having a first thickness and a second grid bar having a second thickness.

Clause 9: the sample support device of clause 1, wherein the inner portion of the grid includes a mark in the region of the grid that is configured to be imaged in an electron microscope and allow an orientation of the grid to be determined during plunge cooling and during measurement in an electron microscope.

Clause 10: the sample support device of clause 1, wherein the outer portion of the grid includes a gripping area having a straight edge, wherein a plunge direction of the sample support device is determined by the straight edge of the gripping area.

Clause 11: the sample support device of clause 1, wherein the outer portion of the grid includes an indentation, and wherein a plunge direction of the sample support device is determined by the indentation.

Clause 12: the sample support device of clause 1, wherein a plunge direction of the sample support device is determined by at least one of the surface marks of the solid region.

Clause 13: the sample support device of clause 1, wherein the grid bars include a first grid bar with a first width elongated along a plunge direction of the sample support device.

Clause 14: the sample support device of clause 13, wherein the grid bars include a second grid bar with a second width elongated along the plunge direction.

Clause 15: the sample support device of clause 13, wherein the first grid bar having the first width is located within a region surrounded by one or more grid bars having a second width.

Clause 16: the sample support device of clause 1, wherein the grid bars include a first grid bar having a first thickness and located within a region surrounded by one or more grid bars having a second thickness.

Clause 17: the sample support device of clause 16, wherein the region having the first grid bar with the first thickness is elongated along a plunge direction of the sample support device.

Clause 18: the sample support device of clause 1, wherein the grid bars include a first grid bar having a first width and located in a central portion of the grid, and a second grid bar having a second width located in a grid portion surrounding the central portion of the grid.

Clause 19: the sample support device of clause 1, wherein the grid includes a first electrically conductive material having a first average thermal expansion coefficient of between about 77 K and about 300 K, and the sample support film includes a second electrically conductive material having a second average thermal expansion coefficient, larger than the average thermal expansion coefficient, of between about 77 K and about 300 K.

Clause 20: the sample support device of clause 1, wherein the grid includes tungsten, titanium, molybdenum, tantalum, and/or alloys thereof, and the sample support film includes gold, copper, nickel, and/or an alloy substantially comprised of gold, copper, or nickel.

Clause 21: the sample support device of clause 1, wherein the sample support film further includes a first film region with a first film thickness and a second film region with second film thickness distinct from the first film thickness.

Clause 22: the sample support device of clause 21, wherein the first and second film regions of the sample support film both include the apertures.

Clause 23: the sample support device of clause 21, wherein the sample support film has a aperture-free solid border, and the solid border has a border thickness larger than the first thickness of the first film region containing the apertures.

Clause 24: the sample support device of clause 21, wherein the first thickness of the first film region is between about 10 nm and about 100 nm.

Clause 25: the sample support device of clause 1, wherein the sample support film includes a low thermal conductivity, high electrical conductivity alloy having a thickness of between about 10 nm and about 100 nm.

Clause 26: the sample support device of clause 23, wherein the low thermal conductivity, high electrical conductivity alloy includes an alloy of chromium and gold with a chromium content of between about 0.1% and about 10%.

Clause 27: the sample support device of clause 1, wherein the apertures of the sample support film are not in continuous communication with the grid holes over at least a portion of the area of the grid and sample support film.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed is:

1. A sample support device, comprising:
    a grid having a first surface, a second surface, a grid thickness, an inner portion, and an outer portion, the inner portion including a plurality of grid bars defining a plurality of holes through the first and second surfaces in between the grid bars, the plurality of holes having a first diameter; and
    a sample support film in contact with the first surface of the grid, the sample support film having a film thickness less than the grid thickness, the sample support film also defining a plurality of apertures extending through the sample support film and including a second diameter smaller than the first diameter of the plurality of holes in the grid,
    wherein the grid includes a first metallic material having a first thermal conductivity and a first electrical conductivity, and the sample support film includes a second metallic material having a second thermal conductivity and a second electrical conductivity less than the first thermal conductivity and the first electrical conductivity, respectively, such that, during cooling of the sample support device with a cryogenic fluid, the second thermal conductivity of the sample support film inhibits heat transfer from the grid bars to the sample support film while allowing the sample support film in the holes defined by the grid bars to cool faster than the grid bars.

2. The sample support device of claim 1, wherein the second metallic material includes a metal alloy of chromium and gold with a chromium content of between 0.1% and 10%.

3. The sample support device of claim 1, wherein the second thermal conductivity of the second metallic material is $\frac{1}{10}$ the first thermal conductivity of the first metallic material.

4. The sample support device of claim 1, wherein the grid thickness is between 10 micrometers and 25 micrometers.

5. The sample support device of claim 1, wherein the film thickness is between 10 nanometers and 100 nanometers.

6. The sample support device of claim 1, wherein the grid bars form a mesh with 200 to 400 cells per linear inch.

7. The sample support device of claim 1, wherein the second diameter of the apertures in the sample support film is between 0.5 micrometers and 2.0 micrometers.

8. The sample support device of claim 1, wherein the sample support film has a solid overlap region having no through-holes and overlapping the grid bars and within a region adjacent to the grid bars.

9. The sample support device of claim 8, wherein the solid overlap region of the sample support film includes a region adjacent to the grid bars with a width of about 5% of a grid bar width or at least two times the first diameter of the holes in the grid.

10. A sample support device, comprising:
    a grid having a first surface, a second surface, a grid thickness, an inner portion, and an outer portion, the inner portion including a plurality of grid bars defining a plurality of holes through the first and second surfaces in between the grid bars, the plurality of holes having a first diameter; and
    a sample support film in contact with the first surface of the grid, the sample support film having a film thickness less than the grid thickness, the sample support film also defining a plurality of apertures extending through the sample support film and including a second diameter smaller than the first diameter of the plurality of holes in the grid, wherein the sample support film further includes a first film region with a first film thickness and a second film region with second film thickness distinct from the first film thickness.

11. The sample support device of claim 10, wherein the first and second film regions of the sample support film both include the apertures.

12. The sample support device of claim 11, wherein an outer periphery of the sample support film is thicker than an inner region of the sample support film.

13. The sample support device of claim 12, wherein the outer periphery of the sample support film is aperture-free.

14. The sample support device of claim 10, wherein the first thickness of the first film region is between about 10 nm and about 100 nm.

* * * * *